US007554161B2

(12) United States Patent
Ahn et al.

(10) Patent No.: US 7,554,161 B2
(45) Date of Patent: Jun. 30, 2009

(54) $HFALO_3$ FILMS FOR GATE DIELECTRICS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/930,431

(22) Filed: Aug. 31, 2004

(65) Prior Publication Data

US 2005/0023624 A1 Feb. 3, 2005

Related U.S. Application Data

(62) Division of application No. 10/163,481, filed on Jun. 5, 2002, now Pat. No. 7,135,421.

(51) Int. Cl.
*H01L 29/72* (2006.01)

(52) U.S. Cl. ....................... 257/368; 257/410; 257/411; 257/412

(58) Field of Classification Search ................. 257/368, 257/410, 411, 412
See application file for complete search history.

(56) References Cited

U.S. PATENT DOCUMENTS

| | | | |
|---|---|---|---|
| 3,381,114 | A | 4/1968 | Nakanuma |
| 4,058,430 | A | 11/1977 | Suntola et al. |
| 4,215,156 | A | 7/1980 | Dalal et al. |
| 4,333,808 | A | 6/1982 | Bhattacharyya et al. |
| 4,394,673 | A | 7/1983 | Thompson et al. |
| 4,399,424 | A | 8/1983 | Rigby |
| 4,413,022 | A | 11/1983 | Suntola et al. |
| 4,590,042 | A | 5/1986 | Drage |
| 4,647,947 | A | 3/1987 | Takeoka et al. |
| 4,767,641 | A | 8/1988 | Kieser et al. |
| 4,920,071 | A | 4/1990 | Thomas |
| 4,993,358 | A | 2/1991 | Mahawili |
| 5,006,192 | A | 4/1991 | Deguchi |

(Continued)

FOREIGN PATENT DOCUMENTS

| | | |
|---|---|---|
| EP | 1096042 | 5/2001 |

(Continued)

OTHER PUBLICATIONS

Sneh et al., "Thin film atomic deposition equipment for semiconductor processing", The Solid Films, 402 (2002) 248-261.*

(Continued)

*Primary Examiner*—Edward Wojciechowicz
(74) *Attorney, Agent, or Firm*—Schwegman, Lundberg & Woessner, P.A.

(57) ABSTRACT

A dielectric film containing $HfAlO_3$ and a method of fabricating such a dielectric film produce a reliable gate dielectric having an equivalent oxide thickness thinner than attainable using $SiO_2$. A gate dielectric is formed by atomic layer deposition employing a hafnium sequence and an aluminum sequence. The hafnium sequence uses $HfCl_4$ and water vapor. The aluminum sequence uses either trimethylaluminium, $Al(CH_3)_3$, or DMEAA, an adduct of alane ($AlH_3$) and dimethylehtylamine $[N(CH_3)_2(C_2H_5)]$, with distilled water vapor. These gate dielectrics containing a $HfAlO_3$ film are thermodynamically stable such that the $HfAlO_3$ film will have minimal reactions with a silicon substrate or other structures during processing.

29 Claims, 8 Drawing Sheets

400
455
450
442
452
432
440
420
434
430
410

U.S. PATENT DOCUMENTS

| | | | |
|---|---|---|---|
| 5,032,545 | A | 7/1991 | Doan et al. |
| 5,049,516 | A | 9/1991 | Arima |
| 5,055,319 | A | 10/1991 | Bunshah et al. |
| 5,080,928 | A | 1/1992 | Klinedinst et al. |
| 5,089,084 | A | 2/1992 | Chhabra et al. |
| 5,198,029 | A | 3/1993 | Dutta et al. |
| 5,302,461 | A | 4/1994 | Anthony |
| 5,595,606 | A | 1/1997 | Fujikawa et al. |
| 5,614,026 | A | 3/1997 | Williams |
| 5,621,681 | A | 4/1997 | Moon |
| 5,625,233 | A | 4/1997 | Cabral, Jr. et al. |
| 5,674,563 | A | 10/1997 | Tarui et al. |
| 5,674,574 | A | 10/1997 | Atwell et al. |
| 5,698,022 | A | 12/1997 | Glassman et al. |
| 5,735,960 | A | 4/1998 | Sandhu et al. |
| 5,744,374 | A | 4/1998 | Moon |
| 5,756,404 | A | 5/1998 | Friedenreich et al. |
| 5,789,030 | A | 8/1998 | Rolfson |
| 5,795,808 | A | 8/1998 | Park |
| 5,801,105 | A | 9/1998 | Yano et al. |
| 5,810,923 | A | 9/1998 | Yano et al. |
| 5,822,256 | A | 10/1998 | Bauer et al. |
| 5,828,080 | A | 10/1998 | Yano et al. |
| 5,840,897 | A | 11/1998 | Kirlin et al. |
| 5,916,365 | A | 6/1999 | Sherman |
| 5,950,925 | A | 9/1999 | Fukunaga et al. |
| 5,963,833 | A | 10/1999 | Thakur |
| 5,972,847 | A | 10/1999 | Feenstra et al. |
| 5,994,240 | A | 11/1999 | Thakur |
| 6,010,969 | A | 1/2000 | Vaarstra |
| 6,013,553 | A | 1/2000 | Wallace et al. |
| 6,020,024 | A | 2/2000 | Maiti et al. |
| 6,025,627 | A | 2/2000 | Forbes et al. |
| 6,027,961 | A | 2/2000 | Maiti et al. |
| 6,040,243 | A | 3/2000 | Li et al. |
| 6,057,271 | A | 5/2000 | Kenjiro et al. |
| 6,059,885 | A | 5/2000 | Ohashi et al. |
| 6,060,743 | A | 5/2000 | Sugiyama et al. |
| 6,060,755 | A | 5/2000 | Ma et al. |
| 6,093,944 | A | 7/2000 | VanDover |
| 6,110,529 | A | 8/2000 | Gardiner et al. |
| 6,114,252 | A | 9/2000 | Donohoe et al. |
| 6,120,531 | A | 9/2000 | Zhou et al. |
| 6,125,062 | A | 9/2000 | Ahn et al. |
| 6,127,287 | A | 10/2000 | Hurley et al. |
| 6,141,238 | A | 10/2000 | Forbes et al. |
| 6,141,260 | A | 10/2000 | Ahn et al. |
| 6,161,500 | A | 12/2000 | Kopacz et al. |
| 6,171,900 | B1 | 1/2001 | Sun |
| 6,174,809 | B1 | 1/2001 | Kang et al. |
| 6,184,146 | B1 | 2/2001 | Donohoe et al. |
| 6,187,484 | B1 | 2/2001 | Glass et al. |
| 6,191,470 | B1 | 2/2001 | Forbes et al. |
| 6,200,893 | B1 | 3/2001 | Sneh |
| 6,203,613 | B1 | 3/2001 | Gates et al. |
| 6,203,726 | B1 | 3/2001 | Danielson et al. |
| 6,206,972 | B1 | 3/2001 | Dunham |
| 6,207,522 | B1 | 3/2001 | Hunt et al. |
| 6,207,589 | B1 | 3/2001 | Ma et al. |
| 6,210,999 | B1 | 4/2001 | Gardner et al. |
| 6,211,035 | B1 | 4/2001 | Moise et al. |
| 6,217,645 | B1 | 4/2001 | Vaartstra |
| 6,218,293 | B1 | 4/2001 | Kraus et al. |
| 6,225,168 | B1 | 5/2001 | Gardner et al. |
| 6,225,237 | B1 | 5/2001 | Vaartstra |
| 6,232,847 | B1 | 5/2001 | Marcy et al. |
| 6,249,460 | B1 | 6/2001 | Forbes et al. |
| 6,255,852 | B1 | 7/2001 | Forbes et al. |
| 6,270,835 | B1 | 8/2001 | Hunt et al. |
| 6,273,951 | B1 | 8/2001 | Vaartstra |
| 6,274,937 | B1 | 8/2001 | Ahn et al. |
| 6,281,042 | B1 | 8/2001 | Ahn et al. |
| 6,281,144 | B1 | 8/2001 | Cleary et al. |
| 6,290,491 | B1 | 9/2001 | Shahvandi et al. |
| 6,291,866 | B1 | 9/2001 | Wallace et al. |
| 6,294,813 | B1 | 9/2001 | Forbes et al. |
| 6,297,095 | B1 | 10/2001 | Muralidhar et al. |
| 6,297,103 | B1 | 10/2001 | Ahn et al. |
| 6,297,516 | B1 | 10/2001 | Forrest et al. |
| 6,297,539 | B1 | 10/2001 | Ma et al. |
| 6,300,203 | B1 | 10/2001 | Buynoski et al. |
| 6,300,255 | B1 | 10/2001 | Venkataranan et al. |
| 6,302,964 | B1 | 10/2001 | Umotoy et al. |
| 6,303,481 | B2 | 10/2001 | Park |
| 6,303,500 | B1 | 10/2001 | Jiang et al. |
| 6,313,035 | B1 | 11/2001 | Sandhu et al. |
| 6,313,518 | B1 | 11/2001 | Ahn et al. |
| 6,331,465 | B1 | 12/2001 | Forbes et al. |
| 6,337,805 | B1 | 1/2002 | Forbes et al. |
| 6,342,445 | B1 | 1/2002 | Marsh |
| 6,348,386 | B1 | 2/2002 | Gilmer |
| 6,350,704 | B1 | 2/2002 | Ahn et al. |
| 6,365,519 | B2 | 4/2002 | Kraus et al. |
| 6,368,398 | B2 | 4/2002 | Vaartstra |
| 6,368,518 | B1 | 4/2002 | Vaartstra |
| 6,368,941 | B1 | 4/2002 | Chen et al. |
| 6,373,740 | B1 | 4/2002 | Forbes et al. |
| 6,380,579 | B1 | 4/2002 | Nam et al. |
| 6,383,861 | B1 | 5/2002 | Gonzalez et al. |
| 6,387,712 | B1 | 5/2002 | Yano et al. |
| 6,391,769 | B1 | 5/2002 | Lee et al. |
| 6,392,257 | B1 | 5/2002 | Ramdani et al. |
| 6,395,650 | B1 | 5/2002 | Callegari et al. |
| 6,407,435 | B1 | 6/2002 | Ma et al. |
| 6,417,537 | B1 | 7/2002 | Yang et al. |
| 6,420,230 | B1 | 7/2002 | Derderian et al. |
| 6,420,279 | B1 | 7/2002 | Ono et al. |
| 6,432,779 | B1 | 8/2002 | Hobbs et al. |
| 6,433,993 | B1 | 8/2002 | Hunt et al. |
| 6,436,203 | B1 | 8/2002 | Kaizuka et al. |
| 6,441,417 | B1 | 8/2002 | Zhang et al. |
| 6,444,039 | B1 | 9/2002 | Nguyen |
| 6,444,042 | B1 | 9/2002 | Yang et al. |
| 6,444,592 | B1 | 9/2002 | Ballantine et al. |
| 6,444,895 | B1 | 9/2002 | Nikawa |
| 6,445,023 | B1 | 9/2002 | Vaartstra et al. |
| 6,448,192 | B1 | 9/2002 | Kaushik |
| 6,451,641 | B1 | 9/2002 | Halliyal et al. |
| 6,451,662 | B1 | 9/2002 | Chudzik et al. |
| 6,451,695 | B2 | 9/2002 | Sneh |
| 6,454,912 | B1 | 9/2002 | Ahn et al. |
| 6,455,717 | B1 | 9/2002 | Vaartstra |
| 6,456,535 | B2 | 9/2002 | Forbes et al. |
| 6,458,701 | B1 | 10/2002 | Chae et al. |
| 6,461,436 | B1 | 10/2002 | Campbell et al. |
| 6,461,914 | B1 | 10/2002 | Roberts et al. |
| 6,461,970 | B1 | 10/2002 | Yin |
| 6,465,334 | B1 | 10/2002 | Buynoski et al. |
| 6,472,321 | B2 | 10/2002 | Srinivasan et al. |
| 6,482,740 | B2 | 11/2002 | Soininen et al. |
| 6,495,436 | B2 | 12/2002 | Ahn et al. |
| 6,498,063 | B1 | 12/2002 | Ping |
| 6,506,666 | B2 | 1/2003 | Marsh |
| 6,509,280 | B2 | 1/2003 | Choi |
| 6,514,348 | B2 | 2/2003 | Miyamoto |
| 6,514,808 | B1 | 2/2003 | Samavedam et al. |
| 6,514,820 | B2 | 2/2003 | Ahn et al. |
| 6,514,828 | B2 | 2/2003 | Ahn et al. |
| 6,518,610 | B2 | 2/2003 | Yang et al. |
| 6,518,634 | B1 | 2/2003 | Kaushik et al. |
| 6,521,911 | B2 | 2/2003 | Parsons et al. |
| 6,524,867 | B2 | 2/2003 | Yang et al. |
| 6,524,901 | B1 | 2/2003 | Trivedi |
| 6,527,866 | B1 | 3/2003 | Matijasevic et al. |

6,531,354 B2 3/2003 Maria et al.
6,533,867 B2 3/2003 Doppelhammer
6,534,357 B1 3/2003 Basceri
6,534,420 B2 3/2003 Ahn et al.
6,537,613 B1 3/2003 Senzaki et al.
6,541,079 B1 4/2003 Bojarczuk, Jr. et al.
6,541,353 B1 4/2003 Sandhu et al.
6,544,846 B2 4/2003 Ahn et al.
6,544,875 B1 4/2003 Wilk
6,551,893 B1 4/2003 Zheng et al.
6,551,929 B1 4/2003 Kori et al.
6,552,383 B2 4/2003 Ahn et al.
6,559,014 B1 5/2003 Jeon
6,559,472 B2 5/2003 Sandhu et al.
6,566,147 B2 5/2003 Basceri et al.
6,566,682 B2 5/2003 Forbes
6,570,248 B1 5/2003 Ahn et al.
6,573,199 B2 6/2003 Sandhu et al.
6,586,349 B1 7/2003 Jeon et al.
6,586,792 B2 7/2003 Ahn et al.
6,586,797 B2 7/2003 Forbes et al.
6,590,252 B2 7/2003 Kutsunai et al.
6,592,661 B1 7/2003 Thakur et al.
6,592,942 B1 7/2003 Van Wijck
6,593,610 B2 7/2003 Gonzalez
6,596,583 B2 7/2003 Agarwal et al.
6,596,636 B2 7/2003 Sandhu et al.
6,600,339 B2 7/2003 Forbes et al.
6,602,338 B2 8/2003 Chen et al.
6,608,378 B2 8/2003 Ahn et al.
6,613,656 B2 9/2003 Li
6,613,695 B2 9/2003 Pomarede et al.
6,613,702 B2 9/2003 Sandhu et al.
6,617,634 B2 9/2003 Marsh et al.
6,617,639 B1 9/2003 Wang et al.
6,620,670 B2 9/2003 Song et al.
6,627,260 B2 9/2003 Derderian et al.
6,627,503 B2 9/2003 Ma et al.
6,632,279 B1 10/2003 Ritala et al.
6,638,859 B2 10/2003 Sneh et al.
6,639,267 B2 10/2003 Eldridge
6,642,567 B1 11/2003 Marsh
6,642,573 B1 11/2003 Halliyal et al.
6,645,882 B1 11/2003 Halliyal et al.
6,652,924 B2 11/2003 Sherman
6,656,371 B2 12/2003 Drewes
6,656,835 B2 12/2003 Marsh et al.
6,660,660 B2 12/2003 Haukka et al.
6,661,058 B2 12/2003 Ahn et al.
6,670,284 B2 12/2003 Yin
6,673,701 B1 1/2004 Marsh et al.
6,674,138 B1 1/2004 Halliyal et al.
6,677,250 B2 1/2004 Campbell et al.
6,682,602 B2 1/2004 Vaartstra
6,683,005 B2 1/2004 Sandhu et al.
6,683,011 B2 1/2004 Smith et al.
6,696,332 B2 2/2004 Visokay et al.
6,699,747 B2 3/2004 Ruff et al.
6,709,989 B2 3/2004 Ramdani et al.
6,710,538 B1 3/2004 Ahn et al.
6,713,846 B1 3/2004 Senzaki
6,720,216 B2 4/2004 Forbes
6,720,221 B1 4/2004 Ahn et al.
6,728,092 B2 4/2004 Hunt et al.
6,730,163 B2 5/2004 Vaartstra
6,731,531 B1 5/2004 Forbes et al.
6,734,480 B2 5/2004 Chung et al.
6,734,510 B2 5/2004 Forbes et al.
6,737,740 B2 5/2004 Forbes et al.
6,737,887 B2 5/2004 Forbes et al.
6,746,930 B2 6/2004 Yang et al.
6,750,066 B1 6/2004 Cheung et al.
6,750,126 B1 6/2004 Visokay et al.
6,753,567 B2 6/2004 Maria et al.
6,754,108 B2 6/2004 Forbes
6,756,298 B2 6/2004 Ahn et al.
6,767,582 B1 7/2004 Elers
6,767,795 B2 7/2004 Ahn et al.
6,778,441 B2 8/2004 Forbes et al.
6,780,704 B1 8/2004 Raaijmakers et al.
6,784,101 B1 8/2004 Yu et al.
6,787,370 B2 9/2004 Forbes
6,787,413 B2 9/2004 Ahn
6,787,888 B2 9/2004 Forbes et al.
6,790,791 B2 9/2004 Ahn et al.
6,794,255 B1 9/2004 Forbes et al.
6,794,709 B2 9/2004 Ahn et al.
6,794,735 B2 9/2004 Forbes et al.
6,803,326 B2 10/2004 Ahn et al.
6,804,136 B2 10/2004 Forbes
6,812,100 B2 11/2004 Ahn et al.
6,812,137 B2 11/2004 Forbes et al.
6,812,157 B1 11/2004 Gadgil
6,815,804 B2 11/2004 Forbes
6,818,067 B2 11/2004 Doering et al.
6,821,862 B2 11/2004 Cho
6,821,873 B2 11/2004 Visokay et al.
6,828,656 B2 12/2004 Forbes et al.
6,831,315 B2 12/2004 Raaijmakers et al.
6,833,285 B1 12/2004 Ahn et al.
6,833,308 B2 12/2004 Ahn et al.
6,833,317 B2 12/2004 Forbes et al.
6,835,111 B2 12/2004 Ahn et al.
6,844,203 B2 1/2005 Ahn et al.
6,844,256 B2 1/2005 Forbes et al.
6,844,260 B2 1/2005 Sarigiannis et al.
6,846,738 B2 1/2005 Forbes et al.
6,852,167 B2 2/2005 Ahn
6,852,613 B2 2/2005 Forbes et al.
6,858,120 B2 2/2005 Ahn et al.
6,858,444 B2 2/2005 Ahn et al.
6,858,865 B2 2/2005 Ahn et al.
6,884,706 B2 4/2005 Forbes et al.
6,884,739 B2 4/2005 Ahn et al.
6,888,739 B2 5/2005 Forbes
6,890,843 B2 5/2005 Forbes et al.
6,893,984 B2 5/2005 Ahn et al.
6,900,116 B2 5/2005 Forbes et al.
6,900,122 B2 5/2005 Ahn et al.
6,900,481 B2 5/2005 Jin et al.
6,903,003 B2 6/2005 Forbes et al.
6,903,367 B2 6/2005 Forbes
6,903,444 B2 6/2005 Forbes et al.
6,906,402 B2 6/2005 Forbes et al.
6,914,278 B2 7/2005 Forbes et al.
6,914,800 B2 7/2005 Ahn et al.
6,919,266 B2 7/2005 Ahn et al.
6,921,702 B2 7/2005 Ahn et al.
6,930,346 B2 8/2005 Ahn et al.
6,933,225 B2 8/2005 Werkhoven et al.
6,950,340 B2 9/2005 Bhattacharyya
6,952,032 B2 10/2005 Forbes et al.
6,953,730 B2 10/2005 Ahn et al.
6,955,968 B2 10/2005 Forbes et al.
6,958,302 B2 10/2005 Ahn et al.
6,958,937 B2 10/2005 Forbes et al.
6,960,538 B2 11/2005 Ahn et al.
6,963,103 B2 11/2005 Forbes
6,979,855 B2 12/2005 Ahn et al.
6,989,573 B2 1/2006 Ahn et al.
7,012,297 B2 3/2006 Bhattacharyya
7,019,351 B2 3/2006 Eppich et al.
7,026,694 B2 4/2006 Ahn et al.
7,037,574 B2 5/2006 Paranjpe et al.
7,042,043 B2 5/2006 Forbes et al.
7,045,430 B2 5/2006 Ahn et al.

7,049,192 B2 5/2006 Ahn et al.
7,064,058 B2 6/2006 Ahn et al.
7,068,544 B2 6/2006 Forbes et al.
7,074,673 B2 7/2006 Forbes
7,075,829 B2 7/2006 Forbes
7,081,421 B2 7/2006 Ahn et al.
7,084,078 B2 8/2006 Ahn et al.
7,087,954 B2 8/2006 Forbes
7,101,813 B2 9/2006 Ahn et al.
7,112,841 B2 9/2006 Eldridge et al.
7,122,464 B2 10/2006 Vaartstra
7,129,553 B2 10/2006 Ahn et al.
7,135,369 B2 11/2006 Ahn et al.
7,135,421 B2 11/2006 Ahn et al.
7,135,734 B2 11/2006 Eldridge et al.
7,160,577 B2 1/2007 Ahn et al.
7,160,817 B2 1/2007 Marsh
7,166,886 B2 1/2007 Forbes
7,169,673 B2 1/2007 Ahn et al.
7,183,186 B2 2/2007 Ahn et al.
7,187,587 B2 3/2007 Forbes
7,192,824 B2 3/2007 Ahn et al.
7,192,892 B2 3/2007 Ahn et al.
7,195,999 B2 3/2007 Forbes et al.
7,199,023 B2 4/2007 Ahn et al.
7,205,218 B2 4/2007 Ahn et al.
7,205,620 B2 4/2007 Ahn et al.
7,208,804 B2 4/2007 Ahn et al.
7,211,492 B2 5/2007 Forbes et al.
7,214,994 B2 5/2007 Forbes et al.
7,221,017 B2 5/2007 Forbes et al.
7,221,586 B2 5/2007 Forbes et al.
7,235,501 B2 6/2007 Ahn et al.
7,235,854 B2 6/2007 Ahn et al.
7,259,434 B2 8/2007 Ahn et al.
7,274,067 B2 9/2007 Forbes
7,309,664 B1 12/2007 Marzolin et al.
7,312,494 B2 12/2007 Ahn et al.
7,326,980 B2 2/2008 Ahn et al.
7,365,027 B2 4/2008 Ahn et al.
7,374,964 B2 5/2008 Ahn et al.
7,388,246 B2 6/2008 Ahn et al.
7,390,756 B2 6/2008 Ahn et al.
7,402,876 B2 7/2008 Ahn et al.
7,405,454 B2 7/2008 Ahn et al.
7,410,668 B2 8/2008 Ahn
7,410,910 B2 8/2008 Ahn et al.
7,410,917 B2 8/2008 Ahn et al.
7,411,237 B2 8/2008 Ahn et al.
2001/0002280 A1 5/2001 Sneh
2001/0002582 A1 6/2001 Dunham
2001/0009695 A1 7/2001 Saanila et al.
2001/0030352 A1 10/2001 Ruf et al.
2001/0042505 A1 11/2001 Vaartstra
2001/0051442 A1 12/2001 Katsir et al.
2001/0053082 A1 12/2001 Chipalkatti et al.
2001/0053096 A1 12/2001 Forbes et al.
2001/0053577 A1 12/2001 Forbes et al.
2002/0000593 A1 1/2002 Nishiyama et al.
2002/0001219 A1 1/2002 Forbes et al.
2002/0001971 A1 1/2002 Cho
2002/0004276 A1 1/2002 Ahn et al.
2002/0004277 A1 1/2002 Ahn et al.
2002/0013052 A1 1/2002 Visokay
2002/0022156 A1 2/2002 Bright
2002/0024080 A1 2/2002 Derderian et al.
2002/0025628 A1 2/2002 Derderian et al.
2002/0028541 A1 3/2002 Lee et al.
2002/0045901 A1 4/2002 Wagner et al.
2002/0046705 A1 4/2002 Sandhu et al.
2002/0048910 A1 4/2002 Taylor et al.
2002/0053869 A1 5/2002 Ahn et al.
2002/0068466 A1 6/2002 Lee et al.
2002/0086507 A1 7/2002 Park et al.
2002/0086555 A1 7/2002 Ahn et al.
2002/0089023 A1 7/2002 Yu et al.
2002/0089063 A1 7/2002 Ahn et al.
2002/0090806 A1 7/2002 Ahn et al.
2002/0094632 A1 7/2002 Agarwal et al.
2002/0100418 A1 8/2002 Sandhu et al.
2002/0102818 A1 8/2002 Sandhu et al.
2002/0105087 A1 8/2002 Forbes et al.
2002/0110991 A1 8/2002 Li
2002/0111001 A1 8/2002 Ahn et al.
2002/0117704 A1 8/2002 Gonzalez
2002/0119297 A1 8/2002 Forrest et al.
2002/0122885 A1 9/2002 Ahn
2002/0130338 A1 9/2002 Ahn et al.
2002/0130378 A1 9/2002 Forbes et al.
2002/0132374 A1 9/2002 Basceri et al.
2002/0135048 A1 9/2002 Ahn et al.
2002/0142536 A1* 10/2002 Zhang et al. ................ 438/216
2002/0142569 A1 10/2002 Chang et al.
2002/0145845 A1 10/2002 Hunt et al.
2002/0145901 A1 10/2002 Forbes et al.
2002/0146916 A1 10/2002 Irino et al.
2002/0148566 A1 10/2002 Kitano et al.
2002/0155688 A1 10/2002 Ahn et al.
2002/0155689 A1 10/2002 Ahn et al.
2002/0164420 A1 11/2002 Derderian et al.
2002/0167057 A1 11/2002 Ahn et al.
2002/0167089 A1 11/2002 Ahn et al.
2002/0175423 A1 11/2002 Forbes et al.
2002/0176989 A1 11/2002 Knudsen et al.
2002/0177244 A1 11/2002 Hsu et al.
2002/0177282 A1 11/2002 Song
2002/0192974 A1 12/2002 Ahn et al.
2002/0192975 A1 12/2002 Ahn
2002/0192979 A1 12/2002 Ahn
2002/0195056 A1 12/2002 Sandhu et al.
2002/0196405 A1 12/2002 Colgan et al.
2002/0197856 A1 12/2002 Matsuse et al.
2002/0197881 A1 12/2002 Ramdani et al.
2003/0001212 A1 1/2003 Hu et al.
2003/0001241 A1 1/2003 Chakrabarti et al.
2003/0003635 A1 1/2003 Paranjpe et al.
2003/0003702 A1 1/2003 Ahn et al.
2003/0003722 A1 1/2003 Vaartstra
2003/0003730 A1 1/2003 Li
2003/0004051 A1 1/2003 Kim et al.
2003/0008243 A1 1/2003 Ahn et al.
2003/0017717 A1 1/2003 Ahn et al.
2003/0020169 A1 1/2003 Ahn et al.
2003/0020180 A1 1/2003 Ahn et al.
2003/0027360 A1 2/2003 Hsu et al.
2003/0032270 A1 2/2003 Snyder et al.
2003/0042526 A1 3/2003 Weimer
2003/0043637 A1 3/2003 Forbes et al.
2003/0045060 A1 3/2003 Ahn
2003/0045078 A1 3/2003 Ahn et al.
2003/0045082 A1 3/2003 Eldridge et al.
2003/0048666 A1 3/2003 Eldridge et al.
2003/0049900 A1 3/2003 Forbes et al.
2003/0049942 A1 3/2003 Haukka et al.
2003/0052356 A1 3/2003 Yang et al.
2003/0052358 A1 3/2003 Weimer
2003/0059535 A1 3/2003 Luo et al.
2003/0064607 A1 4/2003 Leu et al.
2003/0089314 A1 5/2003 Matsuki et al.
2003/0102501 A1 6/2003 Yang et al.
2003/0104666 A1 6/2003 Bojarczuk, Jr. et al.
2003/0106490 A1 6/2003 Jallepally et al.
2003/0119246 A1 6/2003 Ahn
2003/0119291 A1 6/2003 Ahn et al.
2003/0119313 A1 6/2003 Yang et al.
2003/0132491 A1 7/2003 Ahn 2003/0139039 A1 7/2003 Ahn et al.
2003/0141560 A1 7/2003 Sun
2003/0142569 A1 7/2003 Forbes
2003/0157764 A1 8/2003 Ahn et al.
2003/0159653 A1 8/2003 Dando et al.
2003/0170389 A1 9/2003 Sandhu
2003/0170403 A1 9/2003 Doan et al.
2003/0173652 A1 9/2003 Forbes et al.
2003/0173653 A1 9/2003 Forbes et al.
2003/0174529 A1 9/2003 Forbes et al.
2003/0175411 A1 9/2003 Kodas et al.
2003/0176023 A1 9/2003 Forbes et al.
2003/0176025 A1 9/2003 Forbes et al.
2003/0176049 A1 9/2003 Hegde et al.
2003/0176050 A1 9/2003 Forbes et al.
2003/0176052 A1 9/2003 Forbes et al.
2003/0176053 A1 9/2003 Forbes et al.
2003/0181039 A1 9/2003 Sandhu et al.
2003/0183156 A1 10/2003 Dando et al.
2003/0194861 A1 10/2003 Mardian et al.
2003/0194862 A1 10/2003 Mardian
2003/0203626 A1 10/2003 Derderian et al.
2003/0207032 A1 11/2003 Ahn et al.
2003/0207540 A1 11/2003 Ahn et al.
2003/0207564 A1 11/2003 Ahn et al.
2003/0207566 A1 11/2003 Forbes et al.
2003/0207593 A1 11/2003 Derderian
2003/0209324 A1 11/2003 Fink
2003/0216038 A1 11/2003 Madhukar et al.
2003/0222300 A1 12/2003 Basceri et al.
2003/0227033 A1 12/2003 Ahn et al.
2003/0228747 A1 12/2003 Ahn et al.
2003/0235961 A1 12/2003 Metzner et al.
2004/0004244 A1 1/2004 Ahn et al.
2004/0004245 A1 1/2004 Forbes et al.
2004/0004247 A1 1/2004 Forbes et al.
2004/0004859 A1 1/2004 Forbes et al.
2004/0007171 A1 1/2004 Ritala et al.
2004/0009679 A1 1/2004 Yeo et al.
2004/0016944 A1 1/2004 Ahn et al.
2004/0023461 A1 2/2004 Ahn et al.
2004/0023516 A1 2/2004 Londergan et al.
2004/0033681 A1 2/2004 Ahn et al.
2004/0033701 A1 2/2004 Ahn et al.
2004/0036129 A1 2/2004 Forbes et al.
2004/0038554 A1 2/2004 Ahn
2004/0043541 A1 3/2004 Ahn
2004/0043569 A1 3/2004 Ahn
2004/0043635 A1 3/2004 Vaartstra
2004/0075111 A1* 4/2004 Chidambarrao et al. ..... 257/200
2004/0110348 A1 6/2004 Ahn et al.
2004/0110391 A1 6/2004 Ahn et al.
2004/0140513 A1 7/2004 Forbes et al.
2004/0144980 A1 7/2004 Ahn et al.
2004/0159863 A1 8/2004 Eldridge et al.
2004/0164357 A1 8/2004 Ahn et al.
2004/0164365 A1 8/2004 Ahn et al.
2004/0169453 A1 9/2004 Ahn et al.
2004/0175882 A1 9/2004 Ahn et al.
2004/0178439 A1 9/2004 Ahn et al.
2004/0183108 A1 9/2004 Ahn
2004/0185630 A1 9/2004 Forbes et al.
2004/0185654 A1 9/2004 Ahn
2004/0189175 A1 9/2004 Ahn et al.
2004/0196620 A1 10/2004 Knudsen et al.
2004/0198069 A1 10/2004 Metzner et al.
2004/0214399 A1 10/2004 Ahn et al.
2004/0219783 A1 11/2004 Ahn et al.
2004/0222476 A1 11/2004 Ahn et al.
2004/0233010 A1 11/2004 Akram et al.
2004/0248398 A1 12/2004 Ahn et al.
2004/0262700 A1 12/2004 Ahn et al.
2005/0006727 A1 1/2005 Forbes et al.
2005/0007817 A1 1/2005 Forbes et al.
2005/0009370 A1 1/2005 Ahn
2005/0017327 A1 1/2005 Forbes et al.
2005/0020017 A1 1/2005 Ahn et al.
2005/0023574 A1 2/2005 Forbes et al.
2005/0023584 A1 2/2005 Derderian et al.
2005/0023594 A1 2/2005 Ahn et al.
2005/0023625 A1 2/2005 Ahn et al.
2005/0023626 A1 2/2005 Ahn et al.
2005/0023627 A1 2/2005 Ahn et al.
2005/0023650 A1 2/2005 Forbes et al.
2005/0026349 A1 2/2005 Forbes et al.
2005/0026374 A1 2/2005 Ahn et al.
2005/0026458 A1 2/2005 Basceri et al.
2005/0029545 A1 2/2005 Forbes et al.
2005/0029547 A1 2/2005 Ahn et al.
2005/0029604 A1 2/2005 Ahn et al.
2005/0029605 A1 2/2005 Ahn et al.
2005/0030803 A1 2/2005 Forbes et al.
2005/0030825 A1 2/2005 Ahn
2005/0032292 A1 2/2005 Ahn et al.
2005/0034662 A1 2/2005 Ahn
2005/0037563 A1 2/2005 Ahn
2005/0054165 A1 3/2005 Ahn et al.
2005/0077519 A1 4/2005 Ahn et al.
2005/0087134 A1 4/2005 Ahn
2005/0112874 A1 5/2005 Skarp et al.
2005/0124109 A1 6/2005 Quevedo-Lopez et al.
2005/0124174 A1 6/2005 Ahn et al.
2005/0124175 A1 6/2005 Ahn et al.
2005/0138262 A1 6/2005 Forbes
2005/0140462 A1 6/2005 Akram et al.
2005/0145957 A1 7/2005 Ahn et al.
2005/0145959 A1 7/2005 Forbes
2005/0151261 A1 7/2005 Kellar et al.
2005/0158973 A1 7/2005 Ahn et al.
2005/0164521 A1 7/2005 Ahn et al.
2005/0169054 A1 8/2005 Forbes
2005/0227442 A1 10/2005 Ahn et al.
2005/0260357 A1 11/2005 Olsen et al.
2005/0277256 A1 12/2005 Ahn et al.
2005/0280067 A1 12/2005 Ahn et al.
2005/0285225 A1 12/2005 Ahn et al.
2006/0000412 A1 1/2006 Ahn et al.
2006/0001151 A1 1/2006 Ahn et al.
2006/0003517 A1 1/2006 Ahn et al.
2006/0008966 A1 1/2006 Forbes et al.
2006/0023513 A1 2/2006 Forbes et al.
2006/0024975 A1 2/2006 Ahn et al.
2006/0028867 A1 2/2006 Forbes et al.
2006/0028869 A1 2/2006 Forbes et al.
2006/0043492 A1 3/2006 Ahn et al.
2006/0043504 A1 3/2006 Ahn et al.
2006/0046505 A1 3/2006 Ahn et al.
2006/0046522 A1 3/2006 Ahn et al.
2006/0125030 A1 6/2006 Ahn et al.
2006/0128168 A1 6/2006 Ahn et al.
2006/0148180 A1 7/2006 Ahn et al.
2006/0176645 A1 8/2006 Ahn et al.
2006/0177975 A1 8/2006 Ahn et al.
2006/0183272 A1 8/2006 Ahn et al.
2006/0189154 A1 8/2006 Ahn et al.
2006/0223337 A1 10/2006 Ahn et al.
2006/0228868 A1 10/2006 Ahn et al.
2006/0237764 A1 10/2006 Ahn et al.
2006/0244082 A1 11/2006 Ahn et al.
2006/0244100 A1 11/2006 Ahn et al.
2006/0246741 A1 11/2006 Ahn et al.
2006/0252211 A1 11/2006 Ahn et al.
2006/0255470 A1 11/2006 Ahn et al.
2006/0258097 A1 11/2006 Forbes et al.
2006/0261376 A1 11/2006 Forbes et al.
2006/0261397 A1 11/2006 Ahn

| | | | |
|---|---|---|---|
| 2006/0263972 | A1 | 11/2006 | Ahn et al. |
| 2006/0263981 | A1 | 11/2006 | Forbes |
| 2006/0264064 | A1 | 11/2006 | Ahn et al. |
| 2006/0270147 | A1 | 11/2006 | Ahn et al. |
| 2006/0274580 | A1 | 12/2006 | Forbes |
| 2006/0281330 | A1 | 12/2006 | Ahn et al. |
| 2006/0284246 | A1 | 12/2006 | Forbes et al. |
| 2007/0007560 | A1 | 1/2007 | Forbes et al. |
| 2007/0007635 | A1 | 1/2007 | Forbes et al. |
| 2007/0010060 | A1 | 1/2007 | Forbes et al. |
| 2007/0010061 | A1 | 1/2007 | Forbes et al. |
| 2007/0018214 | A1 | 1/2007 | Ahn |
| 2007/0020835 | A1 | 1/2007 | Ahn et al. |
| 2007/0037415 | A1 | 2/2007 | Ahn et al. |
| 2007/0045676 | A1 | 3/2007 | Forbes et al. |
| 2007/0045752 | A1 | 3/2007 | Forbes et al. |
| 2007/0048926 | A1 | 3/2007 | Ahn |
| 2007/0048989 | A1 | 3/2007 | Ahn et al. |
| 2007/0049023 | A1 | 3/2007 | Ahn et al. |
| 2007/0049051 | A1 | 3/2007 | Ahn et al. |
| 2007/0049054 | A1 | 3/2007 | Ahn et al. |
| 2007/0059881 | A1 | 3/2007 | Ahn et al. |
| 2007/0087563 | A1 | 4/2007 | Ahn et al. |
| 2007/0090439 | A1 | 4/2007 | Ahn et al. |
| 2007/0090440 | A1 | 4/2007 | Ahn et al. |
| 2007/0090441 | A1 | 4/2007 | Ahn et al. |
| 2007/0099366 | A1 | 5/2007 | Ahn et al. |
| 2007/0101929 | A1 | 5/2007 | Ahn et al. |
| 2007/0105313 | A1 | 5/2007 | Forbes |
| 2007/0107661 | A1 | 5/2007 | Ahn |
| 2007/0111544 | A1 | 5/2007 | Ahn |
| 2007/0131169 | A1 | 6/2007 | Ahn |
| 2007/0134931 | A1 | 6/2007 | Ahn et al. |
| 2007/0134942 | A1 | 6/2007 | Ahn et al. |
| 2007/0141784 | A1 | 6/2007 | Wager, III et al. |
| 2007/0141832 | A1 | 6/2007 | Farrar |
| 2007/0151861 | A1 | 7/2007 | Xi et al. |
| 2007/0158765 | A1 | 7/2007 | Ahn et al. |
| 2007/0178643 | A1 | 8/2007 | Forbes et al. |
| 2007/0181931 | A1 | 8/2007 | Ahn et al. |
| 2007/0187772 | A1 | 8/2007 | Ahn et al. |
| 2007/0187831 | A1 | 8/2007 | Ahn et al. |
| 2007/0234949 | A1 | 10/2007 | Ahn et al. |
| 2008/0029790 | A1 | 2/2008 | Ahn et al. |
| 2008/0032424 | A1 | 2/2008 | Ahn et al. |
| 2008/0032465 | A1 | 2/2008 | Ahn et al. |
| 2008/0042211 | A1 | 2/2008 | Bhattacharyya et al. |
| 2008/0048225 | A1 | 2/2008 | Ahn et al. |
| 2008/0057659 | A1 | 3/2008 | Forbes |
| 2008/0057690 | A1 | 3/2008 | Forbes |
| 2008/0087945 | A1 | 4/2008 | Forbes et al. |

FOREIGN PATENT DOCUMENTS

| | | |
|---|---|---|
| EP | 1124262 | 8/2001 |
| JP | 62-199019 | 9/1987 |
| JP | 5090169 | 4/1993 |
| JP | 11-335849 | 12/1999 |
| JP | 2001-332546 | 11/2001 |
| WO | WO-01/97257 | 12/2001 |
| WO | WO-02/31875 | 4/2002 |
| WO | WO-0233729 A2 | 4/2002 |
| WO | WO-02/43115 | 5/2002 |
| WO | WO-2006026716 | 3/2006 |

OTHER PUBLICATIONS

PCT Search Report dated Oct. 15, 2003 for application PCT/US 03/17730 completed by S. Nesso.

Aarik, Jaan, et al., "Influence of substrate temperature on atomic layer growth and properties of HfO/sub 2/ thin films" *Thin Solid Films*, 340(1-2). (1999),110-116.

Aarik, Jaan , et al., "Phase transformations in hafnium dioxide thin films grown by atomic layer deposition at high temperatures" *Applied Surface Science*, 173(1-2), (Mar. 2001),15-21.

Alen, Petra, "Atomic Layer deposition of Ta(Al)N(C) thin films using trimethylaluminum as a reducing agent", *Journal of the Electrochemical Society*, 148(10). (Oct. 2001).G566-G571.

Bendoraitis, J G., et al., "Optical energy gaps in the monoclinic oxides of hafnium and zirconium and their solid solutions", *Journal of Physical Chemistry*, 69(10), (1965),3666-3667.

Bright, A A., et al., "Low-rate plasma oxidation of Si in a dilute oxygen/helium plasma for low-temperature gate quality Si/Sio2 interfaces", *Applied Physics Letters*, 58(6), (Feb. 1991),619-621.

Bunshah, Rointan F., et al., "Deposition Technologies for Films and Coatings: Developments and Applications", Park Ridge, N.J., U.S.A.: *Noyes Publications*, (1982),102-103.

Callegari, A. , et al., "Physical and electrical characterization of Hafnium oxide and Hafnium silicate sputtered films", *Journal of Applied Physics*, 90(12), (Dec. 15, 2001),6466-6475.

Cava, R J., "Improvement of the dielectric properties of Ta/sub 2/O/ sub 5/ through substitution with Al/sub 2/O/sub 3/", *Applied Physics Letters*, 70(11), (Mar. 1997),1396-1398.

Chang, Hyo S., et al., "Excellent thermal stability of Al2O3/ZrO2/ Al2O3 stack structure of metal-oxide-semiconductor gate dielectrics application", *Applied Physics Letters*, 80(18), (May 6, 2002),3385-3387.

Cheng, Baohong , et al., "The Impact of High-k Gate Dielectrics and Metal Gate Electrodes on Sub-100nm MOSFET's", *IEEE Transactions on Electron Devices*, 46(7), (Jul. 1999),1537-1544.

Clark, P , "IMEC Highlights Hafnium, Metal Gates for High-k Integration", *Semiconductor Business News*, at Silicon Strategies. com,(Oct. 11, 2002),2 pages.

Clark-Phelps, R. B., el al., "Engineered Tantalum Aluminate and Hafnium Aluminate ALD Films for Ultrathin Dielectric Films with Improved Electric and Thermal Properties", *Gate Stack and Silicide Issues in Silicon Processing II. Symposium* (*Materials Research Society Symposium Proceedings* vol. 670). (Apr. 17, 2001),K2.2.1-6.

Colombo, D. , et al., "Anhydrous Metal Nitrates as Volatile Single Source Precursors for the CVD of Metal Oxide Films", *Communications, Department of EE, U of M, Mpls, MN.* (Jul. 7, 1998),3 pages.

Conley, Jr., J. F., et al., "Atomic Layer Deposition of Hafnium Oxide Using Anhydrous Hafnium Nitrate", *Electrochemical and Solid-State Lett.*, 5, (5), (2002),C57-C59.

Copel, M. , "Structure and stability of ultrathin zirconium oxide layers on Si(001)", *Applied Physics Letters*, 76(4), (Jan. 2000),436-438.

Da Rosa, E B., et al., "Annealing of ZrAl/sub x/O/sub x/O/sub y/ ultrathin films on Si in a vacuum or in O/sub 2/", *Journal of the Electrochemical Society*, 148 (12), (Dec. 2001),G695-G703.

Desu, S B., "Minimization of Fatigue in Ferroelectric Films", *Physica Status Solidi A*, 151(2), (1995),467-480.

Ding, "Copper Barrier, Seed Layer and Planarization Technologies", *VMIC Conference Proceedings*, (1997),87-92.

Engelhardt, M. , "Modern Applications of Plasma Etching and Patterning in Silicon Process Technology", *Contributions to Plasma Physics*, 39(5), (1999),473-478.

Forsgren, Katarina , "Atomic Layer Deposition of HfO2 using hafnium iodide", Conference held in Monterey, California, (May 2001),1 page.

Fuyuki, Takashi , et al., "Initial stage of ultra-thin SiO/sub 2/ formation at low temperatures using activated oxygen", *Applied Surface Science*, 117-118, (Jun. 1997),123-126.

Geller, S. , et al., "Crystallographic Studies of Perovskite-like Compounds. II. Rare Earth Aluminates", *Acta Cryst.*, 9, (May 1956),1019-1025.

Giess, E. A., et al., "Lanthanide gallate perovskite-type substrates for epitaxial, high-T/sub c/superconducting Ba/sub 2/YCu/sub 3/O/sub 7—delta / films", *IBM Journal of Research and Development*, 34(6), (Nov. 1990),916-926.

Guillaumot, B , et al., "75 nm damascene metal gate and high-k integration for advanced CMOS devices", *Technical Digest of International Electron Devices Meeting 2002*, (2002),355-358.

Gusev, E P., et al., "Ultrathin High-K Dielectrics Grown by Atomic Layer Deposition: A Comparative Study of ZrO2, HfO2, Y2O3 and Al2O3", *Electrochemical Society Proceedings* vol. 2001-9, (2001),189-195.
Gutowski, M J., "Thermodynamic stability of high-K dielectric metal oxides ZrO/sub 2/ and HfO/sub 2/ in contact with Si and SiO/sub 2/", *Applied Physics Letters*, 80(11), (Mar. 18, 2002),1897-1899.
Hirayama, Masaki , et al., "Low-Temperature Growth of High-Integrity Silicon Oxide Films by Oxygen Radical Generated in High Density Krypton Plasma", *International Electron Devices Meeting 1999. Technical Digest*, (1999),249-252.
Hubbard, K. J., "Thermodynamic stability of binary oxides in contact with silicon", *Journal of Materials Research*, 11(11), (Nov. 1996),2757-2776.
Hunt, C. E., et al., "Direct bonding of micromachined silicon wafers for laser diode heat exchanger applications", *Journal of Micromechanics and Microengineering*, 1(3), (Sep. 1991),152-156.
Iddles, D M., et al., "Relationships between dopants, microstructure and the microwave dielectric properties of ZrO2-TiO2-SnO2 ceramics", *Journal of Materials Science*, 27(23), (Dec. 1992),6303-6310.
Iijima, T. , "Microstructure and Electrical Properties of Amorphous W-Si-N Barrier Layer for Cu Interconnections", *1996 VMIC Conference*, (1996),168-173.
Jeon, Sanghun , et al., "Ultrathin nitrided-nanolaminate (Al2O3/ZrO2/Al2O3) for metal-oxide-semiconductor gate dielectric applications", *Journal of Vacuum Science & Technology B: Microelectronics and Nanometer Structuresl*, 20(3), (May 2002),1143-1145.
Jung, H S., et al., "Improved current performance of CMOSFETs with nitrogen incorporated HfO/sub 2/-Al/sub 2/O/sub 3/ laminate gate dielectric", *Technical Digest of International Electron Devices Meeting 2002*, (2002),853-856.
Kang, L , et al., "MOSFET devices with polysilicon on single-layer HfO/sub 2/ high-K dielectrics", *International Electron Devices Meeting 2000. Technical Digest. IEDM*, (2000),35-38.
Kawai, Y , et al., "Ultra-low-temperature growth of high-integrity gate oxide films by low-energy Ion-assisted oxidation", *Applied Physics Letters*, 64(17), (Apr. 1994),2223-2225.
Kim, D. , et al., "Atomic Control of Substrate Termination and Heteroepitaxial Growth of SrTiO3/LaAlO3 Films", *Journal of the Korean Physical Society*, 36(6), (Jun. 2000),444-448.
Krauter, G. , et al., "Room Temperature Silicon Wafer Bonding with Ultra-Thin Polymer Films", *Advanced Materials*, 9(5). (1997),417-420.
Kukli, K , et al., "Comparison of hafnium oxide films grown by atomic layer deposition from iodide and chloride precursors", *Thin Solid Films*, 416, (2002),72-79.
Kukli, K , et al., "Controlled growth of yttrium oxysulphide thin films by atomic layer deposition", *Materials Science Forum*, 315-317, (1999),216-221.
Kukli, K J., et al., "Properties of hafnium oxide films grown by atomic layer deposition from hafnium tetraiodide and oxygen", *Journal of Applied Physics*. 92(10), (Nov. 15, 2002),5698-5703.
Lee, Byoung H., et al., "Characteristics of TaN gate MOSFET with ultrathin hafnium oxide (8 A-12 A)", *Electron Devices Meeting, 2000, IEDM Technical Digest. International*. (2000),39-42.
Lee, A E., et al., "Epitaxially grown sputtered LaAlO3 films", *Applied Physics Letters*, 57(19). (Nov. 1990),2019-2021.
Lee, S. J., et al., "Hafnium oxide gate stack prepared by in situ rapid thermal chemical vapor deposition process for advanced gate dielectrics", *Journal of Applied Physics*, 92 (5), (Sep. 1, 2002),2807-2809.
Lee, S J., et al., "High quality ultra thin CVD HfO2 gate stack with poly-Si gate electrode", *Electron Devices Meeting, 2000. IEDM Technical Digest. International*, (2000),31-34.
Lee, Jung-Hyoung , et al., "Mass production worthy HfO/sub 2/-Al/sub 2/O/sub 3/ laminate capacitor technology using Hf liquid precursor for sub-100 nm DRAMs", *Electron Devices Meeting, 2002. IEDM '02. Digest. International*, (2002),221-224.
Lee, L P., et al., "Monolithic 77 K dc Squid magnetometer", *Applied Physics Letters*, 59(23), (Dec. 1991),3051-3053.
Lee, Byoung H., et al., "Ultrathin Hafnium Oxide with Low Leakage and excellent Reliability for Alternative Gate Dielectric Application", *IEEE Technical Digest of International Electron Devices Meeting 1999*. (1999),133-136.
Liu, C. T., "Circuit Requirement and Integration Challenges of Thin Gate Dielectrics for Ultra Small MOSFETs", *International Electron Devices Meeting 1998. Technical Digest*. (1998),747-750.
Liu, Y C., et al., "Growth of ultrathin SiO/sub 2/ on Si by surface irradiation with an O/sub 2/+Ar electron cyclotron resonance microwave plasma at low temperatures", *Journal of Applied Physics*, 85(3), (Feb. 1999),1911-1915.
Lucovsky, G , et al., "Microscopic model for enhanced dielectric constants in low concentration SiO/sub 2/-rich noncrystalline Zr and Hf silicate alloys", *Applied Physics Letters*, 77(18), (Oct. 2000),2912-2914.
Molodyk, A A., et al., "Volatile Surfactant-Assisted MOCVD: Application to LaAl03 Thin Film Growth", *Chemical Vapor Deposition*, 6(3), (Jun. 2000),133-138.
Molsa, Heini , et al., "Growth of yttrium oxide thin films from beta -diketonate precursor", *Advanced Materials for Optics and Electronics*, 4(6), (Nov.-Dec. 1994),389-400.
Nakagawara, Osamu , et al., "Electrical properties of (Zr, Sn)TiO4 dielectric thin film prepared by pulsed laser deposition", *Journal of Applied Physics*, 80(1), (Jul. 1996),388-392.
Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001),1801-1808.
Nieminen, Minna , et al., "Formation and stability of lanthanum oxide thin films deposited from B-diketonate precursor", *Applied Surface Science*, 174(2), (Apr. 16, 2001),155-165.
Oh, C B., et al., "Manufacturable embedded CMOS 6T-SRAM technology with high-k gate dielectric device for system-on-chip applications", *Technical Digest of International Electron Devices Meeting 2002*, (2002),423-426.
Ohring, Milton , "The Materials Science of Thin Films", *Boston : Academic Press*, (1992),118,121,125.
Pan, Tung M., et al., "High quality ultrathin CoTiO/sub 3/ high-k gate dielectrics", *Electrochemical and Solid-State Letters*, 3(9), (Sep. 2000),433-434.
Pan, Tung M., et al., "High-k cobalt-titanium oxide dielectrics formed by oxidation of sputtered Co/Ti or Ti/Co films", *Applied Physics Letters*, 78(10), (Mar. 5, 2001),1439-1441.
Park, Jaehoo , et al., "Chemical vapor deposition of HfO/sub 2/ thin films using a novel carbon-free precursor: characterization of the interface with the silicon substrate", *Journal of the Electrochemical Society*, 149(1), (2002),G89-G94.
Park, Byung-Eun , et al., "Electrical properties of LaAlO3/Si and Sr0.8Bi2.2Ta2O9/LaAlO3/Si structures", *Applied Physics Letters*, 79(6), (Aug. 2001),806-808.
Park, Byoung K., et al., "Interfacial reaction between chemically vapor-deposited HfO2 thin films and a HF-cleaned Si substrate during film growth and postannealing", *Applied Physics Letters*, 80(13), (Apr. 1, 2002),2368-2370.
Perkins, Charles M., et al., "Electrical and materials properties of ZrO2 gate dielectrics grown by atomic layer chemical vapor deposition", *Applied Physics Letters*, 78(16), (Apr. 2001),2357-2359.
Poveshchenko, V P., et al., "Investigation of the phase composition of films of zirconium, hafnium and yttrium oxides", *Soviet Journal of Optical Technology*, 51(5), (1984),277-279.
Ramakrishnan, E S., et al., "Dielectric properties of radio frequency magnetron sputter deposited zirconium titanate-based thin films", *Journal of the Electrochemical Society*, 145(1), (Jan. 1998),358-362.
Rayner Jr., G , et al., "The structure of plasma-deposited and annealed pseudo-binary ZrO2-SiO2 alloys", *Materials Research Society Symposium—Proceedings*, 611, (2002),C131-C139.
Ritala, Mikko , "Atomic Layer Epitaxy Growth of Titanium, Zirconium and Hafnium Dioxide Thin Films", *Annales Academiae Scientiarum Fennicae*, (1994),24-25.
Ritala, Mikko , et al., "Zirconium dioxide thin films deposited by ALE using zirconium tetrachloride as precursor", *Applied Surface Science*, 75, (Jan. 1994),333-340.
Robertson, J. , "Bank offsets of wide-band-gap oxides and implications for future electronic devices", *Journal of Vacuum Science & Technology B* (*Microelectronics and Nanometer Structures*), 18(3), (May-Jun. 2000),1785-1791.

Saito, Yuji , et al., "Advantage of Radical Oxidation for Improving Reliability of Ultra-Thin Gate Oxide", *2000 Symposium on VLSI Technology Digest of Technical Papers*, (2000),176-177.
Shanware, A , et al., "Reliability evaluation of HfSiON gate dielectric film with 12.8 A SiO2 equivalent thickness", *International Electron Devices Meeting. Technical Digest*, (2001),6.6.1-6.6.4.
Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (Jun. 29, 2000),105-114.
Song, Hyun-Jung , et al., "Atomic Layer Deposition of Ta2O5 Films Using Ta(OC2H5)5 and NH3", *Ultrathin SiO/sub 2/ and High-K Materials for ULSI Gate Dielectrics. Symposium*, (1999),469-471.
Stathis, J. H., et al., "Reliability Projection for Ultra-Thin Oxides at Low Voltage", *Tech. Dig. International Electron Device Meeting*, (1998),167-9.
Suntola, T. , "Atomic Layer Epitaxy", *Handbook of Crystal Growth, 3; Thin Films of Epitaxy, Part B: Growth Mechanics and Dynamics*. Amsterdam,(1994),602-663.
Suntola, T , "Atomic layer epitaxy", *Thin Solid Films*, 216(1), (Aug. 28, 1992),84-89.
Sze, S M., "Physics of Semiconductor Devices", *New York : Wiley*, (1981),431.
Sze, S M., "Physics of Semiconductor Devices", *New York : Wiley*, (1981),473.
Takemoto, J. H., et al., "Microstrip Resonators and Filters Using High-TC Superconducting Thin Films on LaAlO3", *IEEE Transaction on Magnetics*,27(2), (Mar. 1991),2549-2552.
Tarre, A , et al., "Comparative study of low-temperature chloride atomic-layer chemical vapor deposition of TiO2 and SnO2", *Applied Surface Science*, 175-176, (May 2001),111-116.
Tavel, B , et al., "High performance 40 nm nMOSFETs with HfO/sub 2/ gate dielectric and polysilicon damascene gate", *Technical Digest of International Electron Devices Meetings 2002*, (2002),429-432.
Van Dover, R. B., et al., "Discovery of a useful thin-film dielectric using a composition-spread approach", *Nature*, 392, (Mar. 12, 1998),162-164.
Viirola, H , "Controlled growth of antimony-doped tin dioxide thin films by atomic layer epitaxy", *Thin Solid Films*, 251, (Nov. 1994),127-135.
Viirola, H , "Controlled growth of tin oxide thin films by atomic layer epitaxy", *Thin Solid Films*, 249(2), (Sep. 1994),144-149.
Wilk, G D., "Hafnium and zirconium silicates for advanced gate dielectrics", *Journal of Applied Physics*, 87(1), (Jan. 2000),484-492.
Wolf, Stanley , et al., "Silicon Processing for the VLSI Era—vol. 1: Process Technology", *Second Edition, Lattice Press*, Sunset Beach, California,(2000),443.
Yamamoto, K. , et al., "Effect of Hf metal predeposition on the properties of sputtered HfO2/Hf stacked gate dielectrics", *Applied Physics Letters*, 81(11), (Sep. 9, 2002),2053-2055.
Zhang, H. , "Atomic Layer Deposition of High Dielectric Constant Nanolaminates", *Journal of The Electrochemical Society*, 148(4), (Apr. 2001),F63-F66.
Zhang, H , "High permittivity thin film nanolaminates", *Journal of Applied Physics*, 87(4), (Feb. 2000),1921-1924.
Zhu, W , et al., "HfO2 and HfAlO for CMOS: Thermal Stability and Current Transport", *IEEE International Electron Device Meeting 2001*, (2001),463-466.
Zucker, O , et al., "Application of Oxygen Plasma Processing to Silicon Direct Bonding", *Sensors and Actuators A*, 36, (1993),227-231.
"Thin Solid Films, Elsevier Science", http://202.114.9.3/xueke/wldz/ak/thin.htm.
Ritala, M. , et al., "Atomic layer deposition of oxide thin films with metal alkoxides as oxygen sources", *Science*, 288(5464), (Apr. 14, 2000),319-321.
Sneh, Ofer , et al., "Thin film atomic layer deposition equipment for semiconductor processing", *Thin Solid Films*, 402(1-2), (2002),248-261.
Ahn, Kie Y., et al., "ALD of Amorphous Lanthanide Doped Tiox Films", U.S. Appl. No. 11/092,072, filed Mar. 29, 2005.
Ahn, Kie Y., et al., "Atomic Layer Deposited Hafnium Tantalum Oxide Dielectrics", U.S. Appl. No. 11/029,757, filed Jan. 5, 2005.
Ahn, Kie Y., et al., "Atomic Layer Deposited Lanthanium Aluminum Oxide Dielectric Layer", U.S. Appl. No. 10/930,167, filed Aug. 31, 2004.
Ahn, Kie Y., et al., "Atomic Layer Deposited Lanthanum Hafnium Oxide Dielectrics", U.S. Appl. 11/010,529, filed Dec. 13, 2004.
Ahn, Kie Y., et al., "Atomic Layer Deposited Titanium Aluminum Oxide Films", U.S. Appl. No. 10/931,533, filed Aug. 31, 2004.
Ahn, Kie Y., et al., "Atomic Layer Deposition of Hf3N4/HfO2 Films as Gate Dielectrics", U.S. Appl. No. 11/063,717, filed Feb. 23, 2005.
Ahn, Kie Y., et al., "Atomic Layer Deposition of Zirconium-Doped Tantalum Oxide Films", U.S. Appl. No. 10/909,959, filed Aug. 2, 2004.
Ahn, Kie Y., et al., "Atomic Layer Deposition of Zr3N4/ZrO2 Films as Gate Dielectrics", U.S. Appl. No. 11/058,563, filed Feb. 15, 2005.
Ahn, Kie Y., et al., "Hybrid ALD- CVD of PrXOY/ZrO2 Films as Gate Dielectrics", U.S. Appl. No. 11/010,766, filed Dec. 13, 2004.
Ahn, Kie Y., et al., "Ruthenium Gate for a Lanthanide Oxide Dielectric Layer", U.S. Appl. No. 10/926, 812, filed Aug. 26, 2004.
Ahn, Kie Y., et al., "Lanthanide Yttrium Aluminum Oxide Dielectric Films", U.S. Appl. No. 11/297,567, filed Dec. 8, 2005.
Ahn, Kie Y., et al., "Lanthanium Aluminum Oxynitride Dielectric Films", U.S. Appl. No. 11/216,474, filed Aug. 31, 2005.
Ahn, Kie Y., et al., "Magnesium Titanium Oxide Films", U.S. Appl. No. 11/189,075, filed Jul. 25, 2005.
Conley, J. F., "Atomic Layer Deposition of Hafnium Oxide Using Anhydrous Hafnium Nitrate", *Electrochemical and Solid-State Letters*, 5(5), (May 2002),C57-C59.
Gordon, Roy G., et al., "Vapor Deposition of Metal Oxides and Silicates: Possible Gate Insulators for Future Microelectronics", *Chemistry of Materials*, 13, (Jul. 10, 2001),2463-2464.
Herman, Marian, "Atomic layer epitaxy—12 years later", *Vacuum*, vol. 42, No. 1-2, (1991),61-66.
Kim, C. T., et al., "Application of $Al_2O_3$ Grown by Atomic Layer Deposition to DRAM and FeRAM", *International Symposium in Integrated Ferroelectrics*, (Mar. 2000),316.
Leskela, M , "ALD precursor chemistry: Evolution and future challenges", *Journal de Physique IV* (Proceedings), 9(8), (Sep. 1999),837-852.
Nalwa, H. S., "Handbook of Thin Film Materials", *Deposition and Processing of thin Films*, vol. 1, San Diego : Academic Press,(2002),114-119.
Ahn, et al., "ALD of Zr-Substituted $BaTiO_3$ Films as Gate Dielectrics", U.S. Appl. No. 11/498,559, filed Aug. 3, 2006.
Ahn, K Y., "Atomic Layer Deposited Barium Strontium Titaium Oxide Films", U.S. Appl. No. 11/510,803, filed Aug. 26, 2006.
Ahn, Kie Y., "Atomic Layer Deposition of $GDSC0_3$ Films as Gate Dielectrics", U.S. Appl. No. 11/215,507, filed Aug. 30, 2005.
Ahn, Kie Y., "Cobalt Titanium Oxide Dielectrics Films", U.S. Appl. No. 11/216,958, filed Aug. 31, 2005.
Ahn, Kie Y., et al., "Hafnium Lanthanide Oxynitride Films", U.S. Appl. No. 11/515,143, filed Aug. 31, 2006.
Ahn, Kie Y., "Magnesium-Doped Zinc Oxide Structures and Methods", U.S. Appl. No. 11/706,820, filed Feb. 13, 2007.
Ahn, Kie Y., et al., "Methods to Form Dielectric Structures in Semiconductor Devices and Resulting Devices", U.S. Appl. No. 11/581,675, filed Aug. 16, 2006.
Ahn, Kie Y., "Molybdenum-Doped Indium Oxide Structures and Methods", U.S. Appl. No. 11/706,944, filed Feb. 13, 2007.
Ahn, Kie Y., et al., "Tungsten-Doped Indium Oxide Structures and Methods", U.S. Appl. No. 11/706,498, filed Feb. 13, 2007.
Ahn, Kie Y., et al., "Zirconium-Doped Zinc Oxide Structures and Methods", U.S. Appl. No. 11/707,173, filed Feb. 13, 2007.
Forbes, "Hafnium Aluminium Oxynitride High-K Dieletric and Metal Gates", U.S. Appl. No. 11/514,558, filed Aug. 31, 2006.
Forbes, "Hafnium Tantalum Oxynitride High-K Dielectric and Metal Gates", U.S. Appl. No. 11/515,114, filed Aug. 31, 2005.
Forbes, Leonard, et al., "Silicon Lanthanide Oxynitride Films", U.S. Appl. No. 11/514,533, filed Aug. 31, 2006.

Forbes, et al., "Tantalum Aluminum Oxynitride High-K Dielectric and Metal Gates", U.S. Appl. No. 11/514,655, filed Aug. 31, 2006.
Forbes, Leonard, et al., "Tantalum Silicon Oxynitride High-K Dielectrics and Metal Gates", U.S. Appl. No. 11/514,601, filed Aug. 31, 2006.
Wilk, G. D., "High-K gate dielectrics: Current status and materials properties considerations", *Journal of Applied Physics*, 89(10), (May 2001), 5243-5275.

* cited by examiner

$HFALO_3$ FILMS FOR GATE DIELECTRICS

CROSS REFERENCE TO RELATED APPLICATIONS

This application is a Divisional of U.S. application Ser. No. 10/163,481 filed on Jun. 5, 2002, now U.S. Pat. No. 7,135,421, which application is herein incorporated by reference.

This application is related to the following, commonly assigned applications, incorporated herein by reference:

U.S. application Ser. No. 10/137,499 filed on 2 May 2002, now U.S. Pat. No. 7,045,430, entitled: "Atomic Layer-Deposited $LaAlO_3$ Films for Gate Dielectrics,"

U.S. application Ser. No. 10/137,058 filed on 2 May 2002, entitled: "Atomic Layer Deposition and Conversion,"

U.S. application Ser. No. 10/137,168 filed on 2 May 2002, now U.S. Pat. No. 7,160,577, entitled: "Methods for Atomic-Layer Deposition of Aluminum Oxides in Integrated Circuits," and U.S. application Ser. No. 09/797,324 filed on 1 Mar. 2001, now U.S. Pat. No. 6,852,167, entitled: "Methods, Systems, and Apparatus for Uniform Chemical-Vapor Depositions."

FIELD OF THE INVENTION

The invention relates to semiconductor devices and device fabrication. Specifically, the invention relates to gate dielectric layers of transistor devices and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, where the body region 132 defines a channel of the transistor with a channel length 134. A gate dielectric, or gate oxide 140 is located on the body region 132 with a gate 150 located over the gate dielectric. Although the gate dielectric can be formed from materials other than oxides, the gate dielectric is typically an oxide, and is commonly referred to as a gate oxide. The gate may be fabricated from polycrystalline silicon (polysilicon), or other conducting materials such as metal may be used.

In fabricating transistors to be smaller in size and reliably operating on lower power supplies, one important design criteria is the gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but increased scaling and other requirements for gate dielectrics create the need to find other dielectric materials to be used for a gate dielectric.

What is needed is an alternate dielectric material for forming a gate dielectric that has a high dielectric constant relative to $SiO_2$, and is thermodynamically stable with respect to silicon such that forming the dielectric on a silicon layer will not result in $SiO_2$ formation, or diffusion of material, such as dopants, into the gate dielectric from the underlying silicon layer.

DETAILED DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
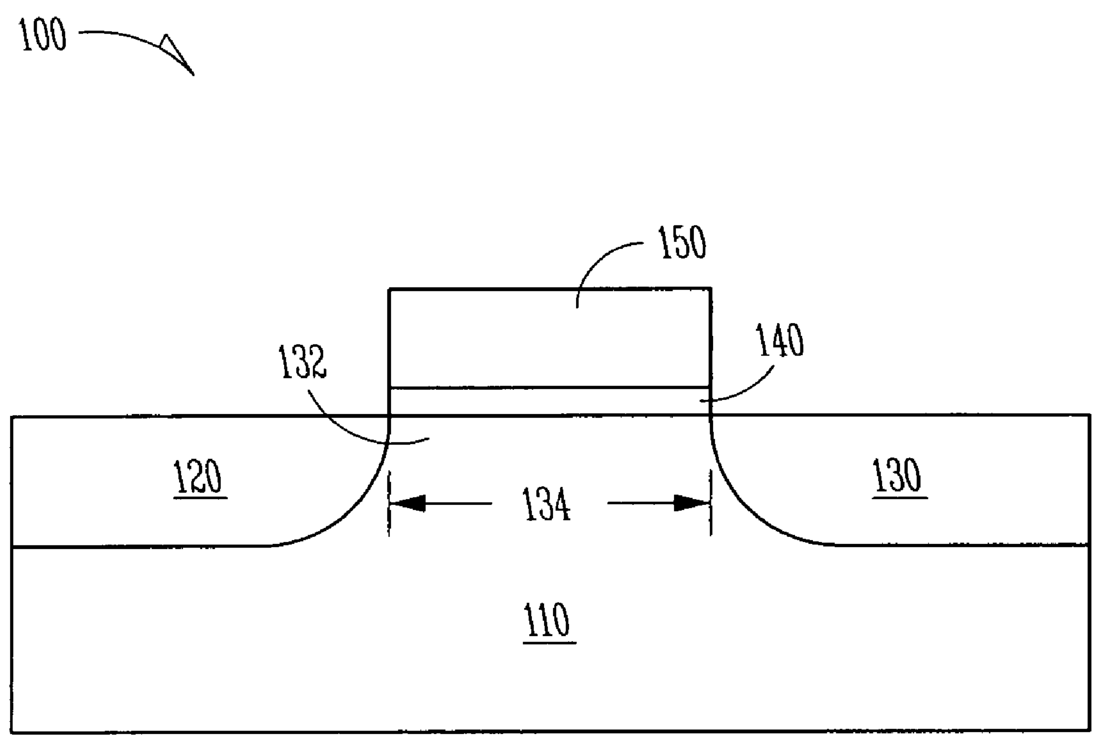
FIG. 1 depicts a common configuration of a transistor.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will also have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to $t_{eq}$ for a given capacitance with the dielectric constant of $SiO_2$, $\kappa_{ox}=3.9$, associated with $t_{eq}$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, the reduced equivalent oxide thickness of transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

In a recent article by G. D. Wilk et al., *Journal of Applied Physics*, vol. 89: no. 10, pp. 5243-5275 (2001), material properties of high dielectric materials for gate dielectrics were discussed. Among the information disclosed was the viability of $Al_2O_3$ as a substitute for $SiO_2$. $Al_2O_3$ was disclosed has having favourable properties for use as a gate dielectric such as high band gap, thermodynamic stability on Si up to high temperatures, and an amorphous structure. In addition, Wilk disclosed that forming a layer of $Al_2O_3$ on silicon does not result in a $SiO_2$ interfacial layer. However, the dielectric constant of $Al_2O_3$ is only 9, where thin layers may have a dielectric constant of about 8 to about 10. Though the dielectric constant of $Al_2O_3$ is in an improvement over $SiO_2$, a higher dielectric constant for a gate dielectric is desirable. Other dielectrics and their properties discussed by Wilk include

| Material | Dielectric Constant (κ) | Band gap $E_g$ (eV) | Crystal Structure(s) |
|---|---|---|---|
| $SiO_2$ | 3.9 | 8.9 | Amorphous |
| $Si_3N_4$ | 7 | 5.1 | Amorphous |
| $Al_2O_3$ | 9 | 8.7 | Amorphous |
| $Y_2O_3$ | 15 | 5.6 | Cubic |
| $La_2O_3$ | 30 | 4.3 | Hexagonal, Cubic |
| $Ta_2O_5$ | 26 | 4.5 | Orthorhombic |
| $TiO_2$ | 80 | 3.5 | Tetrag. (rutile, anatase) |
| $HfO_2$ | 25 | 5.7 | Mono., Tetrag., Cubic |
| $ZrO_2$ | 25 | 7.8 | Mono., Tetrag., Cubic |

One of the advantages using $SiO_2$ as a gate dielectric has been that the formation of the $SiO_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric can cause variations in the film's dielectric constant. The abovementioned material properties including structure are for the materials in a bulk form. The materials having the advantage of a high dielectric constants relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

In co-pending, commonly assigned U.S. patent application: entitled "Atomic Layer-Deposited $LaAlO_3$ Films for Gate Dielectrics," Ser. No. 10/137,499, $LaAlO_3$ is disclosed as a replacement for $SiO_2$ for forming gate dielectrics and other dielectric films in electronic devices such as MOS transistors. This application discloses, among other things, forming layers of $LaAlO_3$ on silicon by atomic layer deposition using a lanthanum containing source and an aluminum containing source. Controlling a lanthanum sequence deposition and an aluminum sequence deposition allows for the formation of a gate dielectric having a composition with a predetermined dielectric constant.

In one embodiment, a method of forming a gate dielectric on a transistor body region includes the atomic layer deposition (ALD) of an amorphous film containing $HfAlO_3$ on the transistor body region. The ALD formation of the $HfAlO_3$ film is performed by pulsing a hafnium containing precursor into a reaction chamber containing a substrate, pulsing a first oxygen containing precursor into the reaction chamber, pulsing an aluminum containing precursor into the reaction chamber, and pulsing a second oxygen containing precursor into the reaction chamber. Each precursor is pulsed into the reaction chamber for a selected time period. A length of time for pulsing each precursor is selected according to the precursor used. Between each precursor pulsing, precursor excess and reaction by-products are removed from the reaction. The $HfAlO_3$ film thickness is controlled by repeating for a number of cycles the pulsing of the hafnium containing precursor, the first oxygen containing precursor, the aluminum containing precursor, and the second oxygen containing precursor until the desired thickness is formed.

In an embodiment according to the teachings of the present invention, layers of $HfAlO_3$ are deposited on silicon using atomic layer deposition (ALD), also known as atomic layer epitaxy (ALE). ALD was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with an inert gas or evacuated. In the first pulsing phase, reaction with the substrate occurs with the precursor saturatively chemisorbed at the substrate surface. Subsequent purging with an inert gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

Advantageously, in ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward, simple manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other requirements for precursors used in ALD. The precursors must be thermally stable at the substrate temperature because their decomposition would destroy the surface control and accordingly the advantages of the ALD method which relies on the reactant of the precursor at the substrate surface. Of course, a slight decomposition, if slow compared to the ALD growth, can be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In one embodiment, a $HfAlO_3$ film is formed on a substrate mounted in a reaction chamber by pulsing a hafnium containing precursor into the reaction chamber followed by pulsing a first oxygen containing precursor, and by pulsing an aluminum containing precursor into the reaction chamber followed by pulsing a second oxygen containing precursor into the reaction chamber. Between each pulsing, a purging gas is introduced into the reaction chamber. Pulsing a hafnium containing precursor into the reaction chamber followed by pulsing a first oxygen containing precursor with subsequent purging after each pulsing constitutes a hafnium sequence. Similarly, pulsing an aluminum containing precursor into the reaction chamber followed by pulsing a second oxygen containing precursor into the reaction chamber with subsequent purging after each pulsing constitutes an aluminum sequence. The selection of the first oxygen containing precursor depends upon the hafnium containing precursor pulsed into the chamber, and likewise, the second oxygen containing precursor depends upon the aluminum precursor pulsed into the chamber. Additionally, different purging gases can be employed for the hafnium sequence and the aluminum sequence. Furthermore, pulsing each precursor into the reaction chamber is individually controlled for a predetermined period, where the predetermined period for each precursor differs according to the nature of the precursor.

The precursors are selected such that performing one hafnium sequence followed by performing an aluminum sequence completes one cycle of ALD deposition of a $HfAlO_3$ layer. The thickness of this $HfAlO_3$ layer will depend on the precursors used, the period of the pluses, and the processing temperature. A $HfAlO_3$ film with a predetermined thickness is formed by repeating for a number of cycles the hafnium sequence and the aluminum sequence. Once a $HfAlO_3$ film with the desired thickness is formed, the $HfAlO_3$ film is annealed.

In an embodiment of the present invention, precursor gases are used to form $HfAlO_3$ films as a gate dielectric on a transistor body. Alternately, solid or liquid precursors can be used in an appropriately designed reaction chamber. ALD formation of other materials is disclosed in co-pending, commonly assigned U.S. patent applications: entitled "Atomic Layer Deposition and Conversion," Ser. No. 10/137,058, and "Atomic Layer of $AlO_x$ for ULSI Gate Atomic Layer Deposition for Gate Dielectric Layer," Ser. No. 10/137,168.

Figure 2A:
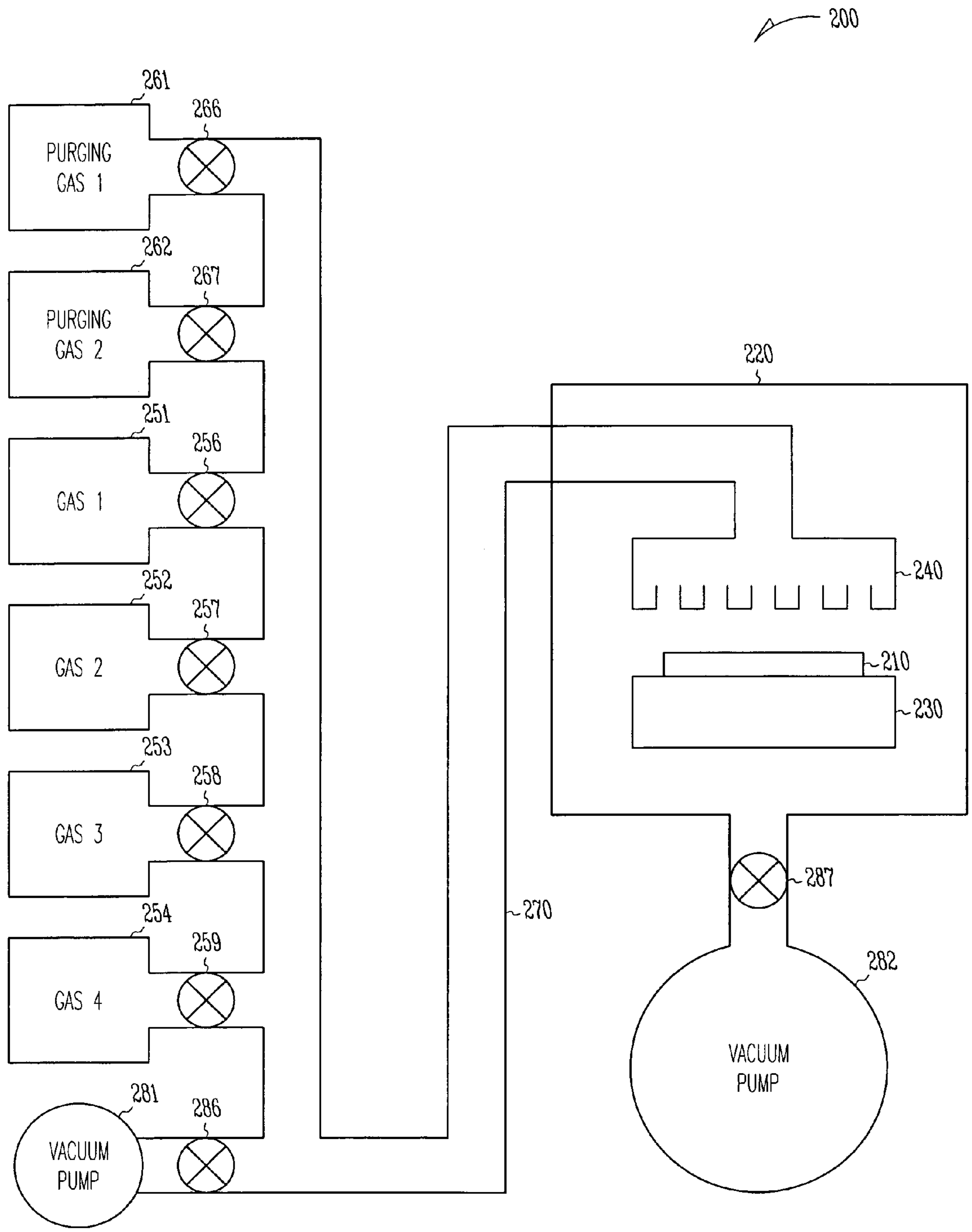
FIG. 2A depicts an embodiment of an atomic layer deposition system for processing a $HfAlO_3$ film according to the teachings of the present invention.

FIG. 2A depicts an embodiment of an atomic layer deposition system for processing a $HfAlO_3$ film according to the teachings of the present invention. The elements depicted are those elements necessary for discussion of the present invention such that those skilled in the art may practice the present invention without undue experimentation. A further discussion of the ALD reaction chamber can be found in co-pending, commonly assigned U.S. patent application: entitled "Methods, Systems, and Apparatus for Uniform Chemical-Vapor Depositions," Ser. No. 09/797,324, incorporated herein by reference. In FIG. 2A, a substrate 210 is placed inside a reaction chamber 220 of ALD system 200. Also located within the reaction chamber 220 is a heating element 230 which is thermally coupled to substrate 210 to control the substrate temperature. A gas-distribution fixture 240 introduces precursor gases to the substrate 210. Each precursor gas originates from individual gas sources 251-254 whose flow is controlled by mass-flow controllers 256-259, respectively. The gas sources 251-254 provide a precursor gas either by storing the precursor as a gas or by providing a location and apparatus for evaporating a solid or liquid material to form the selected precursor gas.

Also included in the ALD system are purging gas sources 261, 262, each of which is coupled to mass-flow controllers 266, 267, respectively. The gas sources 251-254 and the purging gas sources 261-262 are coupled by their associated mass-flow controllers to a common gas line or conduit 270 which is coupled to the gas-distribution fixture 240 inside the reaction chamber 220. Gas conduit 270 is also coupled to vacuum pump, or exhaust pump, 281 by mass-flow controller 286 to remove excess precursor gases, purging gases, and by-product gases at the end of a purging sequence from the gas conduit.

Vacuum pump, or exhaust pump, 282 is coupled by mass-flow controller 287 to remove excess precursor gases, purging gases, and by-product gases at the end of a purging sequence from the reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
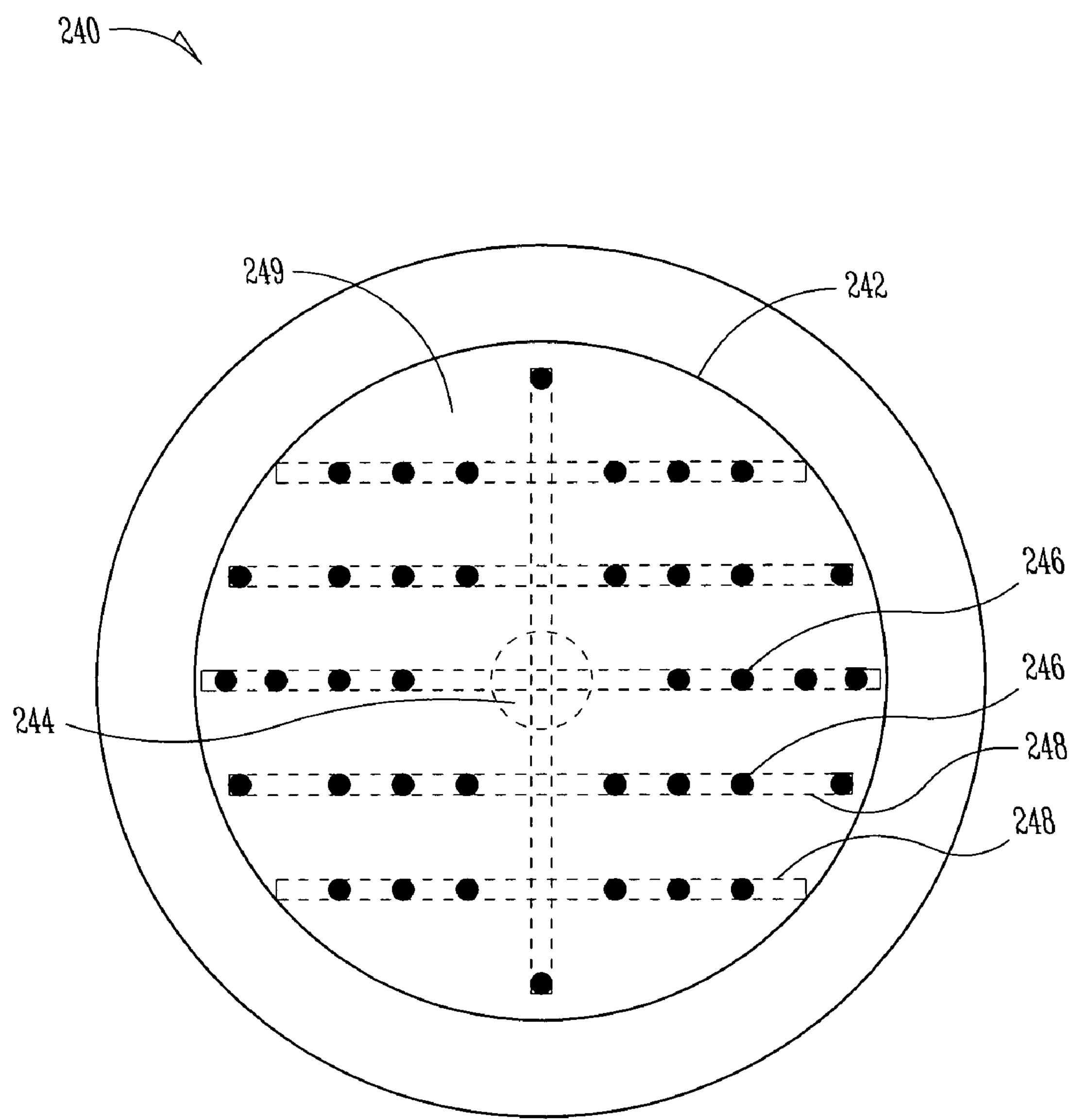
FIG. 2B depicts an embodiment of a gas-distribution fixture of an atomic layer deposition chamber for processing a $HfAlO_3$ film according to the teachings of the present invention.

FIG. 2B depicts an embodiment of a gas-distribution fixture of an atomic layer deposition chamber for processing a $HfAlO_3$ film according to the teachings of the present invention. Gas-distribution fixture 240 includes a gas-distribution member 242, and a gas inlet 244. Gas inlet 244 couples the gas-distribution member 242 to the gas conduit 270 of FIG. 2A. Gas-distribution member 242 includes gas-distribution holes, or orifices, 246 and gas-distribution channels 248. In the exemplary embodiment, holes 246 are substantially circular with a common diameter in the range of 15-20 microns; gas-distribution channels 248 have a common width in the range of 20-45 microns. The surface 249 of the gas distribution member having gas-distribution holes 246 is substantially planar and parallel to the substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though the ALD system 200 is well suited for practicing the present invention, other ALD systems commercially available can be used.

The use, construction and fundamental operation of reaction chambers for deposition of films are understood by those of ordinary skill in the art of semiconductor fabrication. The present invention man be practiced on a variety of such reaction chambers without undue experimentation. Furthermore, one of ordinary skill in the art will comprehend the necessary detection, measurement, and control techniques in the art of semiconductor fabrication upon reading the disclosure.

Figure 3:
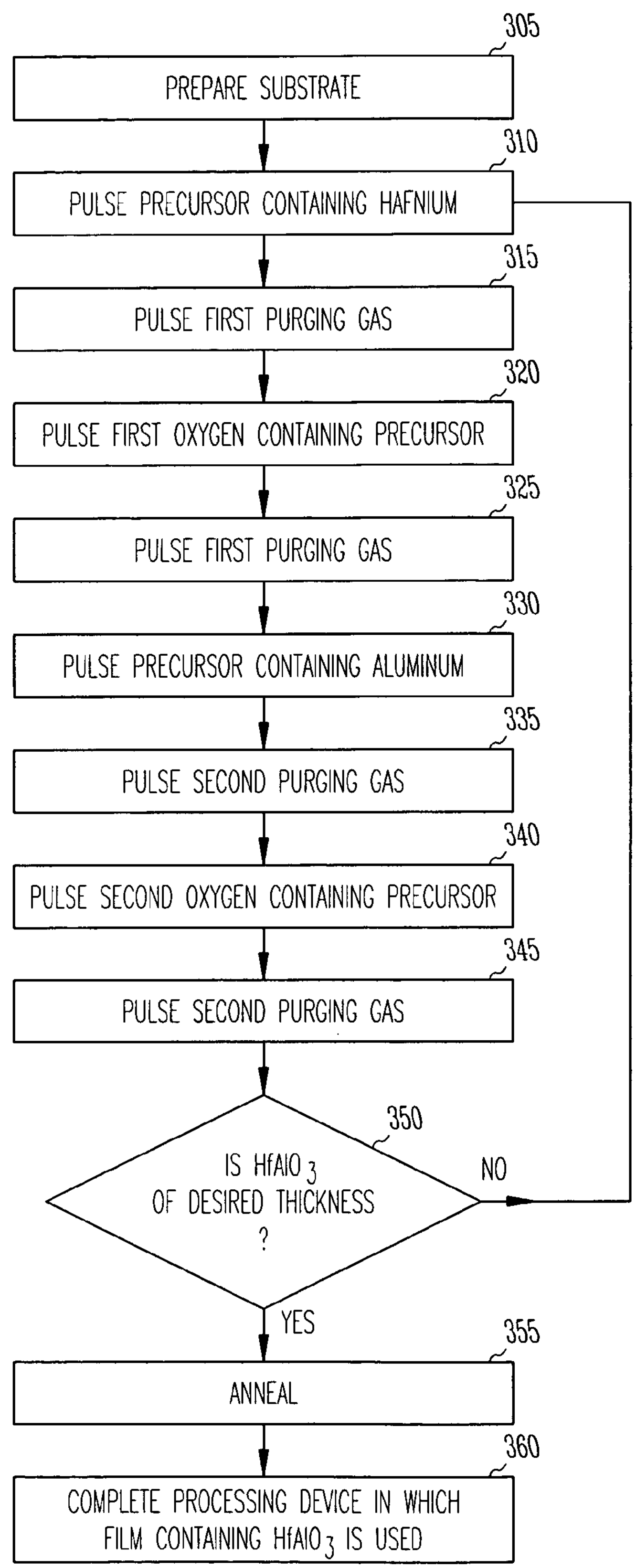
FIG. 3 illustrates a flow diagram of elements for an embodiment of a method to process a $HfAlO_3$ film according to the teachings of the present invention.

FIG. 3 illustrates a flow diagram of elements for an embodiment of a method to process a $HfAlO_3$ film according to the teachings of the present invention. The method can be implemented with the atomic layer deposition system of FIG.

2A,B. At block 305, a substrate is prepared. The substrate used for forming a transistor is typically a silicon or silicon containing material. In other embodiments, germanium, gallium arsenide, and silicon-on-sapphire substrates may be used. This preparation process includes cleaning of the substrate 210 and forming layers and regions of the substrate, such as drains and sources of a metal oxide semiconductor (MOS) transistor, prior to forming a gate dielectric. The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 210 in its ready for processing form is conveyed into a position in reaction chamber 220 for ALD processing.

At block 310, a precursor containing hafnium is pulsed into reaction chamber 220. In particular, $HfCl_4$ is used as a source material. The $HfCl_4$ is pulsed into reaction chamber 220 through the gas-distribution fixture 240 onto substrate 210. The flow of the $HfCl_4$ is controlled by mass-flow controller 256 from gas source 251. The $HfCl_4$ source gas temperature ranges from about 130° C. at about 154° C. The $HfCl_4$ reacts with the surface of the substrate 210 in the desired region defined by the unmasked areas of the substrate 210.

At block 315, a first purging gas is pulsed into the reaction chamber 220. In particular, pure nitrogen with a purity greater than 99.99% is used as a purging gas for $HfCl_4$. The nitrogen flow is controlled by mass-flow controller 266 from the purging gas source 261 into the gas conduit 270. Using the pure nitrogen purge avoids overlap of the precursor pulses and possible gas phase reactions. Following the purge, at block 320, a first oxygen containing precursor is pulsed into the reaction chamber 220. For the hafnium sequence using $HfCl_4$ as the precursor, water vapor is selected as the precursor acting as an oxidizing reactant to form a hafnium oxide on the substrate 210. The water vapor is pulsed into the reaction chamber 220 through gas conduit 270 from gas source 252 by mass-flow controller 257 with a flow rate ranging from about 0.5 to about 1.0 mPa $m^3$/sec. The water vapor aggressively reacts at the surface of substrate 210.

Following the pulsing of oxidizing reactant water vapor, at block 325, the first purging gas is injected into the reaction chamber 220. In the $HfCl_4$/water vapor sequence, pure nitrogen gas is used to purge the reaction chamber after pulsing each precursor gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

During the $HfCl_4$/water vapor sequence, the substrate is held between about 350° C. and about 550° C. by the heating element 230 with the reaction chamber used in a low-pressure (250 Pa) hot wall configuration. In other embodiments the substrate is held between about 500° C. and 1000° C. The $HfCl_4$ pulse time ranges from about 1.0 sec to about 2.0 sec. After the $HfCl_4$ pulse, the hafnium sequence continues with a purge pulse followed by a water vapor pulse followed by a purge pulse. In one embodiment, performing a purge pulse followed by a water vapor pulse followed by a purge pulse takes about 2 seconds. In another embodiment, each pulse in the hafnium sequence after the $HfCl_4$ pulse has a 2 second pulse period.

At block 330, a precursor containing aluminum is pulsed into the reaction chamber 220. In one embodiment, trimethylaluminium (TMA), $Al(CH_3)_3$, is used as the aluminum containing precursor following the $HfCl_4$/ozone sequence. The TMA is pulsed to the surface of the substrate 210 through gas-distribution fixture 240 from gas source 253 by mass-flow controller 258. The TMA is introduced onto the hafnium oxide film that was formed during the $HfCl_4$/water vapor sequence.

At block 335, a second purging gas is introduced into the system. For a TMA precursor, purified argon is used as a purging and carrier gas. The argon flow is controlled by mass-flow controller 267 from the purging gas source 262 into the gas conduit 270 and subsequently into the reaction chamber 220. Following the argon purge, at block 340, a second oxygen containing precursor is pulsed into the reaction chamber 220. For the aluminum sequence using TMA as the precursor, distilled water vapor is selected as the precursor acting as an oxidizing reactant to interact with the TMA on the substrate 210. The distilled water vapor is pulsed into the reaction chamber 220 through gas conduit 270 from gas source 254 by mass-flow controller 259. The distilled water vapor aggressively reacts at the surface of substrate 210 to form a $HfAlO_3$ film.

Following the pulsing of the distilled water vapor acting as an oxidizing reactant, at block 345, the second purging gas is injected into the reaction chamber 200. In the TMA/distilled water vapor sequence, argon gas is used to purge the reaction chamber after pulsing each precursor gas. In another embodiment, pure nitrogen is again used as the purging gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286. This completes not only the TMA/distilled water vapor sequence, but it also completes a hafnium sequence/aluminum sequence cycle forming a $HfAlO_3$ layer having a set thickness associated with one ALD cycle.

During the TMA/distilled water vapor sequence, the substrate is held between about 350° C. and about 450° C. by the heating element 230. The reaction chamber is maintained at about 150° C. to minimize reactant condensation. The process pressure is maintained at about 230 mTorr during the pulsing of the precursor gases and at about 200 mTorr for the purging gases. Pulse times for the TMA and the distilled water vapor were about 1 sec for both precursors, with purging pulse times of about 15 secs. In one embodiment, the substrate temperature is maintained at about 350° C. for the complete $HfCl_4$/water vapor/TMA/distilled water vapor cycle. In another embodiment, the substrate temperature is maintained at about 550° C. for the complete $HfCl_4$/water vapor/TMA/distilled water vapor cycle.

As an alternate aluminum sequence, a DMEAA/oxygen sequence can be employed rather than the TMA/distilled water vapor sequence. The aluminum containing precursor DMEAA is an adduct of alane ($AlH_3$) and dimethylehtylamine $[N(CH_3)_2(C_2H_5)]$. At block 330, the DMEAA is pulsed to the substrate 210 surface form gas source 253. The DMEAA gas can be provided to gas source 253 through a bubbler-type evaporation controlled at 25° C. The purging and carrier gas associated with DMEAA, at block 335, is hydrogen from purging gas source 262. At block 340, to provide the necessary reaction at the substrate 210, oxygen as the second oxygen containing precursor is pulsed into the reaction chamber 220 from gas source 254. At block 345, hydrogen purging gas is again flowed through the reaction chamber 220 from purging gas source 262.

During the DMEAA/oxygen sequence, the substrate is held between about 100° C. and about 125° C. by the heating element 230. The process pressure during the DMEAA/oxygen sequence is maintained at about 30 mTorr.

In an alternate aluminum sequence using DMEAA, a DMEAA/distilled water vapor sequence can used under the same temperature and pressure ranges as the TMA/distilled water sequence. In an embodiment of the present invention, the substrate temperature is maintained at about 350° C. for the complete $HfCl_4$/water vapor/DMEAA/distilled water vapor cycle. Alternately, the complete $HfCl_4$/water vapor/DMEAA/distilled water vapor cycle can be performed with the substrate temperature maintained at about 550° C.

The thickness of a $HfAlO_3$ film after one cycle is determined by the pulsing periods used in the hafnium sequence and the aluminum sequence at a given temperature. The pulsing periods of the ALD process depend upon the characteristics of the reaction system 200 employed and the precursor and purging sources. Typically, at a given temperature, the pulsing periods can vary over a significant range above some minimum pulse time for the precursors, without substantially altering the growth rate. Once a set of periods for one cycle is determined, the growth rate for the $HfAlO_3$ film will be set at a value such as N nm/cycle. For a desired $HfAlO_3$ film thickness, t, in an application such as forming a gate dielectric of a MOS transistor, the ALD process should be repeated for t/N cycles.

At block 350, it is determined whether the $HfAlO_3$ film is of the desired thickness, t. As mentioned, the desired thickness should be completed after t/N cycles. If less than t/N cycles have been completed, the process starts over at block 310 with the pulsing of the precursor containing hafnium, which in the embodiment discussed above is a $HfCl_4$ gas. If t/N cycles have completed, no further ALD processing is requires and the $HfAlO_3$ film, at block 355, is annealed. The annealing is a final heating cycle for producing the $HfAlO_3$ film and is performed at a temperature between about 300° C. and about 800° C. to produce optimum performance as a dielectric insulator. The annealing can be performed in an inert or nitrogen atmosphere.

At block 360, after forming the $HfAlO_3$ film, processing the device containing the $HfAlO_3$ film is completed. In one embodiment, completing the device includes completing the formation of a transistor. Alternately, completing the process includes completing the construction of a memory device having a array with access transistors formed with $HfAlO_3$ film gate dielectrics. Further, in another embodiment, completing the process includes the formation of an electronic system including an information handling device that uses electronic devices with transistors formed with $HfAlO_3$ film gate dielectrics. Typically, information handling devices such as computers include many memory devices, having many access transistors.

In one embodiment, a $HfAlO_3$ film for use as a gate dielectric is formed on a body region of a transistor by the ALD process using a hafnium/water vapor/aluminum/water vapor cycle. This cycle is the combination of a hafnium/water vapor sequence and an aluminum/water sequence. Terminating the cycle at the end of a hafnium/water vapor sequence would typically result in a $HfO_2$ film. Performing just an aluminum/water sequence would typically result in an $Al_2O_3$ film.

In a recent article by W. Zhu et al., *International Electron Devices Meeting* 01, pp. 463-466 (2001), growth of $HfO_2$ and HfAlO films by the Jet-Vapor deposition method was reported. $HfO_2$ films of approximately 3 nm appear to crystallize at 400° C.-500° C., while HfAlO films with about 6.8% Al crystallize at about 200° C. higher, and HfAlO films with about 31.7% Al crystallize at about 400° C. higher than the $HfO_2$ films. Thus, this article indicates that HfAlO films tend to form crystalline structures when processed at higher temperatures. However, amorphous structures have advantages as gate dielectrics.

In a recent article by J. Aarik et al., *Applied Surface Science*, vol. 173, pp. 15-21 (2001), growth of $HfO_2$ films by ALD using a $HfCl_4$/water vapor sequence was reported. The $HfCl_4$ source temperature ranged from 130° C. to 154° C. with the substrate temperature maintained at different temperatures in the range from 500° C. to 1000° C. For a substrate temperature of 940° C. and a water vapor flow rate of 0.7 $mPa/m^3$, the resultant film structure was found to be dependant on the $HfCl_4$ source temperature. At a $HfCl_4$ source temperature of 128° C. the film was monoclinic with a growth rate of 0.034 nm/cycle, while at a $HfCl_4$ source temperature of 152° C. the film was cubic with a growth rate of 0.067 nm/cycle. The report concluded the surface structure of $HfO_2$ films grown by ALD using $HfCl_4$ and water vapor can be varied when changing the growth temperature and precursor doses.

In a recent article by Y. Kim et al., *Applied Physics Letters*, vol. 71 (25), pp. 3604-3606 (1997), growth of $Al_2O_3$ films by ALD using a TMA/distilled water vapor sequence was reported. With the substrate temperature maintained at 370° C., and the pulsing time for the TMA and the distilled water vapor set each at 1 second, the growth rate for the $Al_2O_3$ films was determined to be about 0.19 nm per cycle. This growth rate was determined to be the same for TiN, Si, and $SiO_2$ substrates. An $Al_2O_3$ growth rate of 24.4 Å per cycle at 100° C. by ALD, for a cycle using DMEAA as a precursor for five Al depositions followed by $O_2$ plasma oxidation, was reported in a recent article by C. Jeong et al., *Japanese Journal of Applied Physics*, vol. 40 part 1 no. 1, pp. 285-289 (2001). Typically, $Al_2O_3$ films formed by ALD are amorphous.

A dielectric film containing $HfAlO_3$, $Al_2O_3$, and $HfO_2$ has a dielectric constant ranging from the dielectric constant of $Al_2O_3$, 9, to the dielectric constant of $HfO_2$, 25. By controlling the number of cycles of the hafnium sequence and the number of cycles of the aluminum sequence, the amount of hafnium and aluminum deposited on the surface region of a substrate can be controlled. Thus, a dielectric film formed by ALD using a hafnium sequence and a aluminum sequence can be formed with a composition containing selected or predetermined percentages of $HfAlO_3$, $Al_2O_3$, and $HfO_2$, in which case the effective dielectric constant of the film will be selected or predetermined in the range from 9 to 25. Furthermore, using an aluminum sequence subsequent to a hafnium sequence, the resulting dielectric containing $HfAlO_3$ should be amorphous.

In addition to separately controlling the number of cycles of the hafnium sequence and the aluminum sequence in the ALD process, a dielectric film containing $HfAlO_3$ can be engineered with selected characteristics by also controlling precursor materials for each sequence, processing temperatures and pressures for each sequence, individual precursor pulsing times, and heat treatment at the end of the process, at the end of each cycle, and at the end of each sequence. The heat treatment may include in situ annealing in various atmospheres including argon and nitrogen.

The pulsing times for precursors range from about 0.5 sec to about 2 to 3 sec, though longer pulses can be employed.

Typically, pulsing times for purging gases will range from a time equal to its associated precursor pulse time to an order of magnitude larger than the associated precursor pulse time in order than all excess material and by-products be purged from the reaction system. Generally, the pulsing times for purging gases will range from about one sec to about 30 seconds. In one embodiment, the pulsing times for purging gases is in the 1-2 sec range.

The growth rates for an engineered film containing $HfAlO_3$ will be controlled by the growth rates of the individual sequences and typically can be from about 0.34 Å per cycle to about 5 Å per cycle. Other growth rates may also be attained.

A range of equivalent oxide thickness, $t_{eq}$, attainable in various embodiments of the present invention is associated with the capability to provide a composition having a dielectric constant in the range form about 9 to about 25, and the capability to attain physical film thickness in the range of from about 2 to about 3 nm and above. The $t_{eq}$ range in accordance with the present invention are shown in the following

| κ | Physical Thickness t = 0.5 nm (5 Å) $t_{eq}$ (Å) | Physical Thickness t = 1.0 nm (10 Å) $t_{eq}$ (Å) | Physical Thickness t = 5.0 nm (50 Å) $t_{eq}$ (Å) |
|---|---|---|---|
| 9 | 2.17 | 4.33 | 21.67 |
| 17 | 1.15 | 2.29 | 11.47 |
| 21 | .93 | 1.86 | 9.29 |
| 25 | .78 | 1.56 | 7.8 |

The lower limit on the scaling of a layer containing $HfAlO_3$ would depend on the monolayers of the film necessary to develop a full band gap such that good insulation is maintained between an underlying silicon layer and an overlying conductive layer to the $HfAlO_3$ film. This requirement is necessary to avoid possible short circuit effects between the underlying silicon layer and the overlying conductive layer. From above, it is apparent that a film containing $HfAlO_3$ can be attained with a $t_{eq}$ ranging from 3 Å to 12 Å. Further, a film with essentially no interfacial layer can provide a $t_{eq}$ significantly less than 2 or 3 Å, even less than 1.5 Å.

The novel process described above provides significant advantages by performing atomic layer deposition with a hafnium sequence/aluminum sequence deposition cycle. Further, by independently controlling the various parameters for each sequence a gate dielectric with a selected dielectric constant can be formed. Additionally, the novel process can be implemented to form transistors, memory devices, and information handling devices.

Advantageously, a gate dielectric formed as a $HfAlO_3$ film has a larger dielectric constant than silicon dioxide, a relatively small leakage current, and good stability with respect to a silicon based substrate. Embodiments according to the teachings of the present invention include forming transistors, memory devices, and electronic systems having dielectric layers containing $HfAlO_3$.

Other embodiments include structures for transistors, memory devices, and electronic systems with dielectric gates of $HfAlO_3$ film. Such dielectric gates provide a significantly thinner equivalent oxide thickness compared with a silicon oxide gate having the same physical thickness. Alternatively, such dielectric gates provide a significantly thicker physical thickness than a silicon oxide gate having the same equivalent oxide thickness.

A transistor 100 as depicted in FIG. 1 can be formed by forming a source/drain region 120 and another source/drain region 130 in a silicon based substrate 110 where the two source/drain regions 120, 130 are separated by a body region 132. The body region 132 separated by the source/drain 120 and the source/drain 130 defines a channel having a channel length 134. A $HfAlO_3$ film is formed by ALD by pulsing a hafnium containing precursor into a reaction chamber containing the substrate 110, pulsing a first oxygen containing precursor into the reaction chamber, pulsing an aluminum containing precursor into the reaction chamber, and pulsing a second oxygen containing precursor into the reaction chamber. Each precursor is pulsed into the reaction chamber for a selected time period. A length of time for pulsing each precursor is selected according to the precursor used. Between each precursor pulsing, precursor excess and reaction by-products are removed from the reaction chamber. The $HfAlO_3$ film thickness is controlled by repeating for a number of cycles the pulsing of the hafnium containing precursor, the first oxygen containing precursor, the aluminum containing precursor, and the second oxygen containing precursor until the desired thickness for film 140 containing $HfAlO_3$ is formed on the body region. A gate is formed over the gate dielectric 140. Typically, forming the gate includes forming a polysilicon layer, though a metal gate can be formed in an alternative process. Forming the substrate, source/region regions, and the gate is performed using standard processes known to those skilled in the art. Additionally, the sequencing of the various elements of the process for forming a transistor is conducted with standard fabrication processes, also as known to those skilled in the art.

Figure 4:
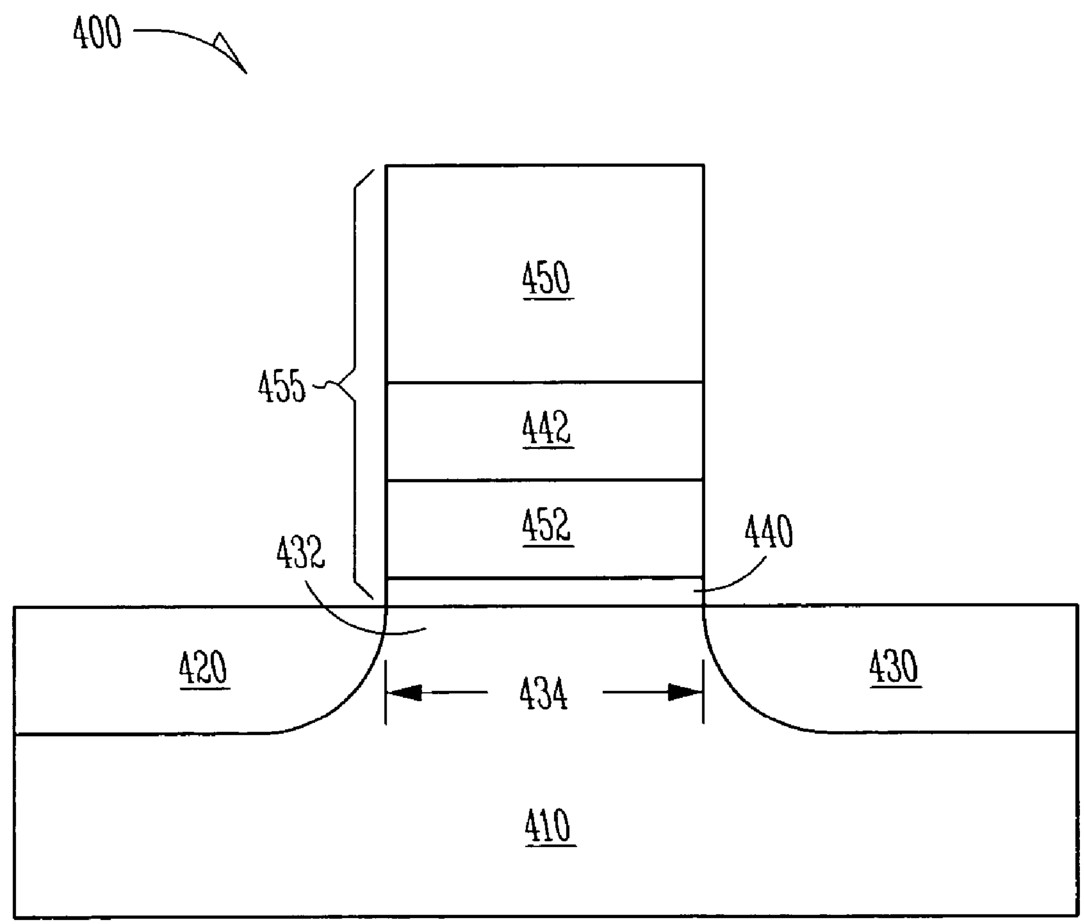
FIG. 4 depicts an embodiment of a configuration of a transistor capable of being fabricated according to the teachings of the present invention.

Embodiments of the method of forming a $HfAlO_3$ film by ALD as a gate dielectric can be applied to other transistor structures having dielectric layers. For example, FIG. 4 depicts an embodiment of a configuration of a transistor 400 capable of being fabricated according to the teachings of the present invention. The transistor 400 includes a silicon based substrate 410 with two source/drain regions 420, 430 separated by a body region 432. The body region 432 between the two source/drain regions 420, 430 defines a channel region having a channel length 434. Located above the body region 432 is a stack 455 including a gate dielectric 440, a floating gate 452, a floating gate dielectric 442, and control gate 450. The gate dielectric 440 is formed in an ALD process according to the teachings of the present invention as described above with the remaining elements of the transistor 400 formed using processes known to those skilled in the art. Alternately, both the gate dielectric 440 and the floating gate dielectric 442 can be formed by ALD in accordance with the present invention as described above.

Figure 5:
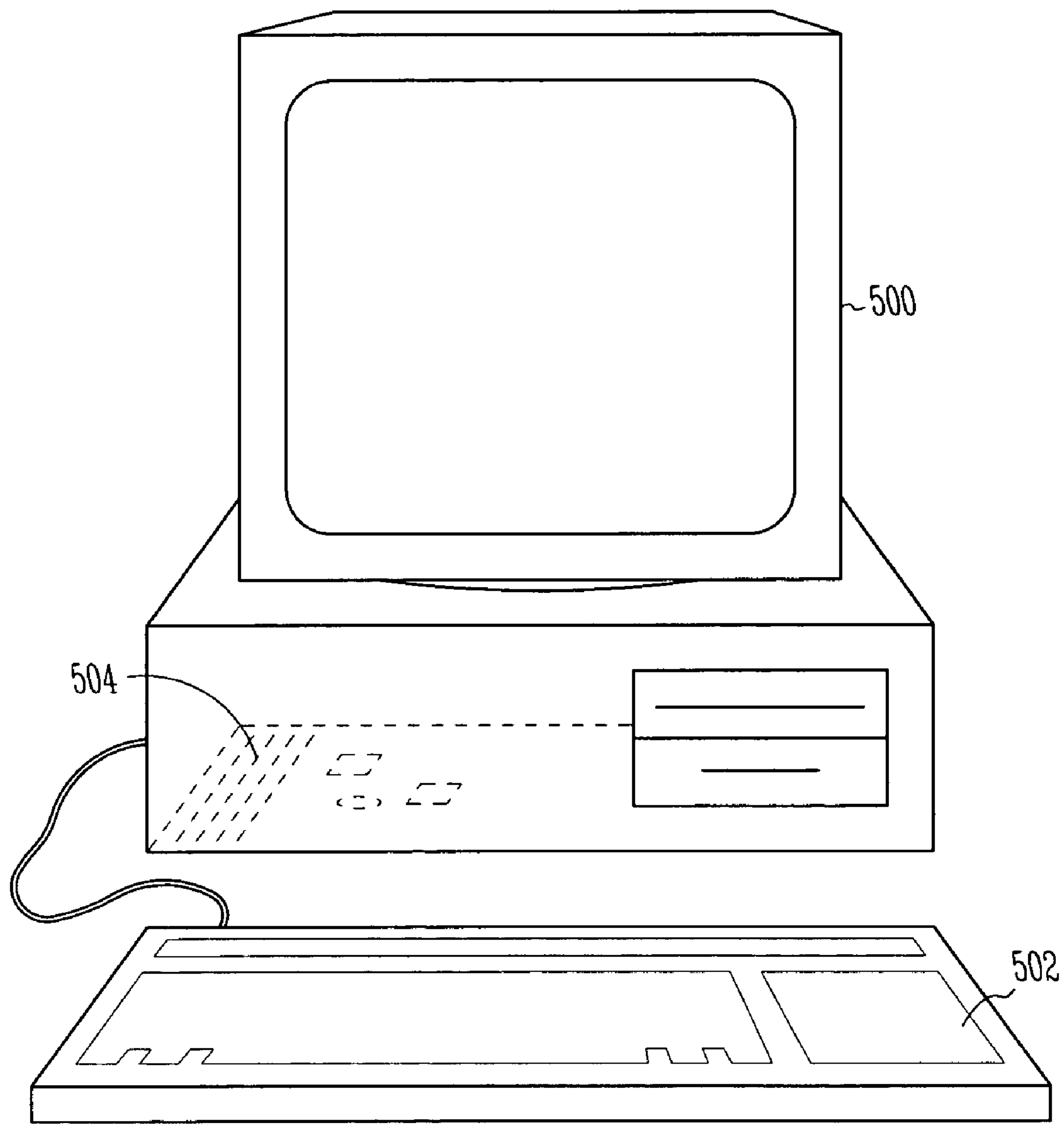
FIG. 5 illustrates a perspective view of an embodiment of a personal computer incorporating devices according to the teachings of the present invention.
Figure 6:
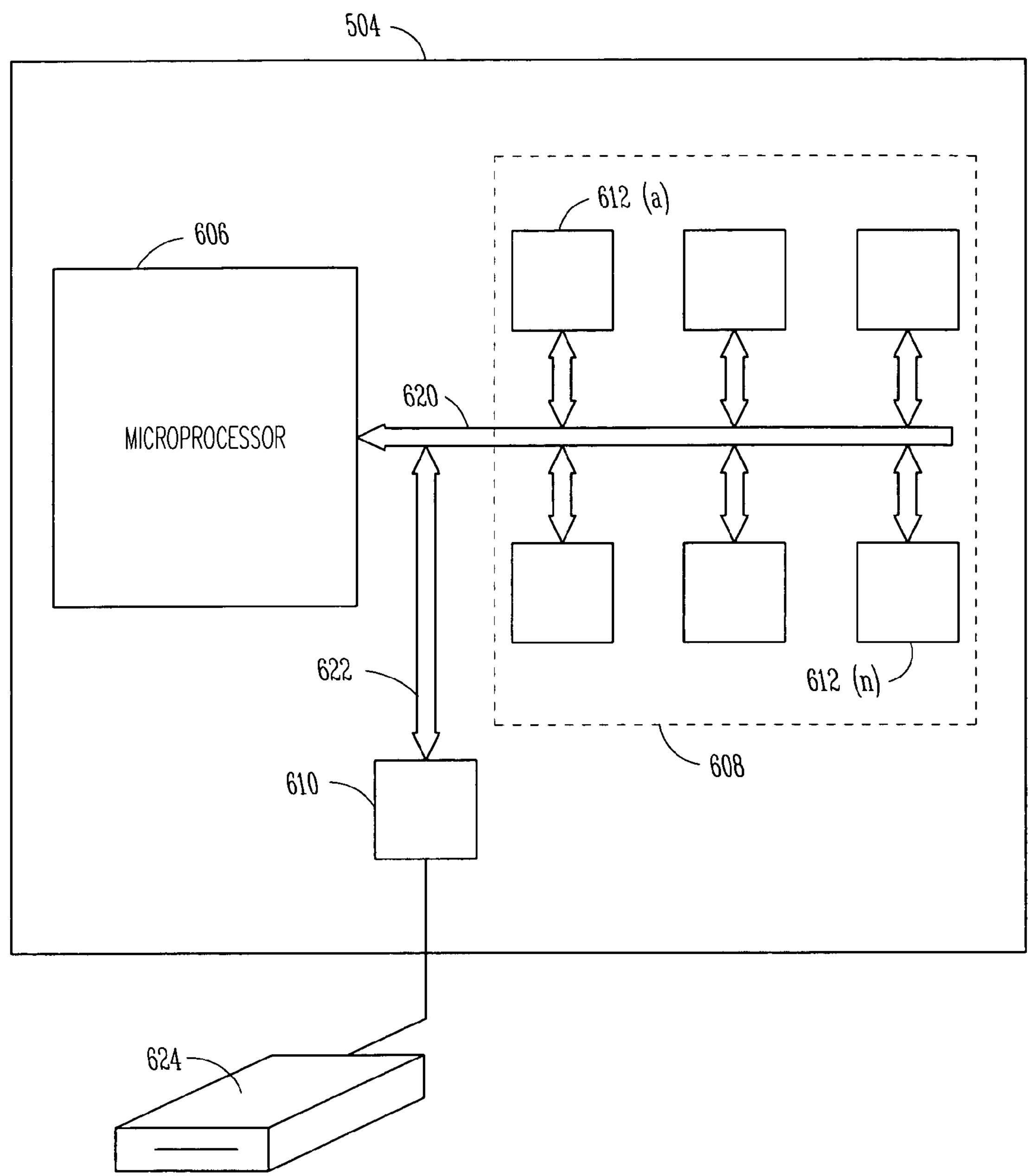
FIG. 6 illustrates a schematic view of an embodiment of a central processing unit incorporating devices according to the teachings of the present invention.
Figure 7:
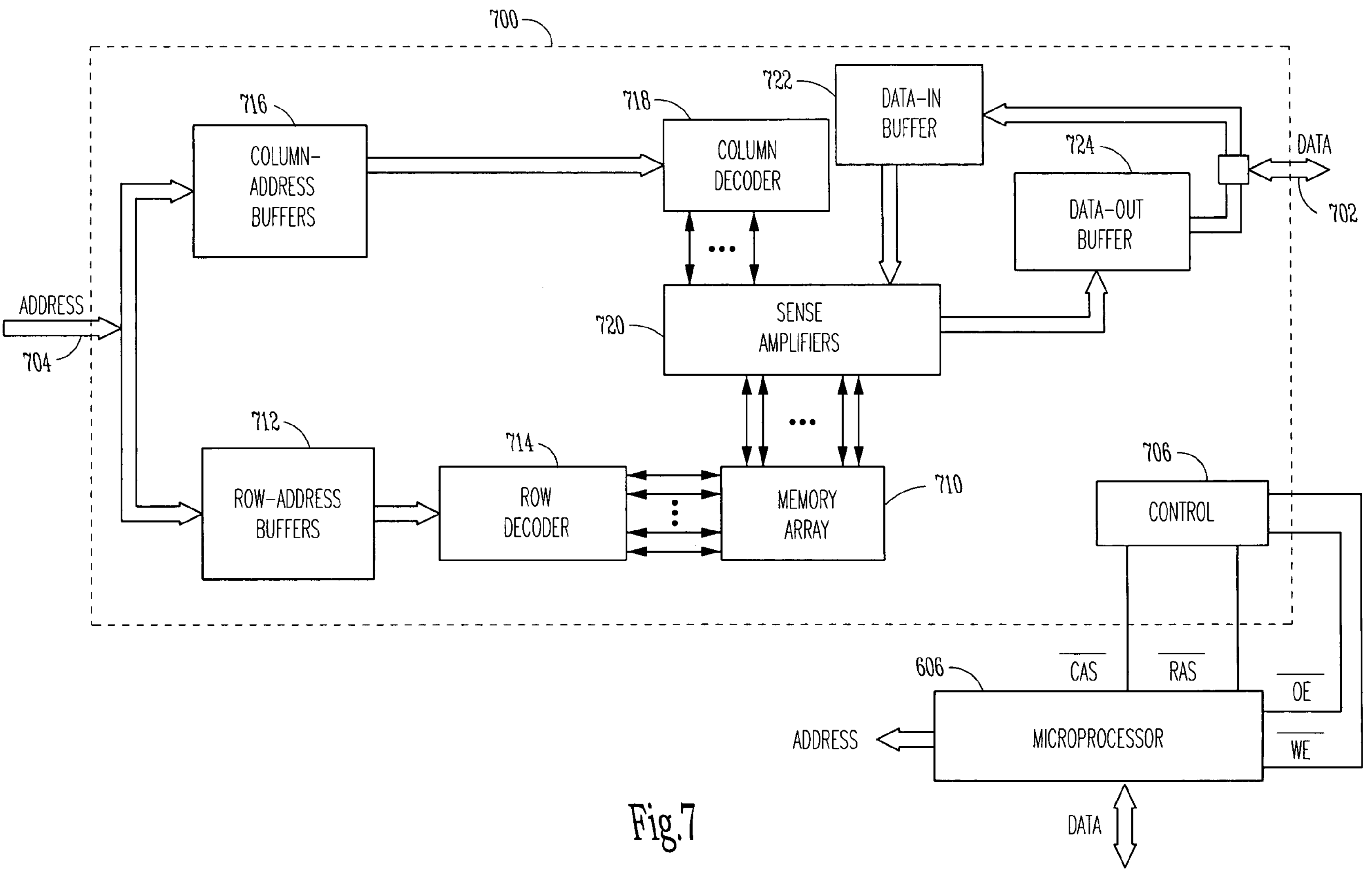
FIG. 7 illustrates a schematic view of an embodiment of a DRAM memory device according to the teachings of the present invention.

Transistors created by the methods described above may be implemented into memory devices and electronic systems including information handling devices. Information handling devices having a dielectric layer containing a $HfAlO_3$ film can be constructed using various embodiments of the methods described above. Such information devices include wireless systems, telecommunication systems, and computers. An embodiment of a computer having a dielectric layer containing a $HfAlO_3$ film is shown in FIGS. 5-7 and described below. While specific types of memory devices and computing devices are shown below, it will be recognized by one skilled in the art that several types of memory devices and electronic systems including information handling devices utilize the invention.

A personal computer, as shown in FIGS. 5 and 6, include a monitor 500, keyboard input 502 and a central processing unit 504. The processor unit 504 typically includes microprocessor 606, memory bus circuit 608 having a plurality of memory slots 612(*a-n*), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate dielectric containing a $HfAlO_3$ film in an embodiment according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(*a-n*) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 608.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 620. Other alternative types of devices include SDRAM, DDR SDRAM, SLDRAM and Direct RDRAM as well as others such as SRAM or Flash memories.

FIG. 7 illustrates a schematic view of an embodiment of a DRAM memory device 700 according to the teachings of the present invention. DRAM device 700 is compatible with memory slots 612(*a-n*). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 6 includes at least one transistor having a gate dielectric containing a $HfAlO_3$ film in an embodiment according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common word line. The word line is coupled to gates of individual transistors, where at least one transistor has a gate coupled to a gate dielectric containing $HfAlO_3$ in accordance with the method and structure previously described above. Additionally, each memory cell in a column is coupled to a common bit line. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a word line driver, an address decoder tree, and circuitry which translates a given row address received from row address buffers 712 and selectively activates the appropriate word line of memory array 710 via the word line drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bit lines of memory array 710.

Sense amplifiers 720 are coupled to data-in buffers 722 and data-out buffers 724. Data-in buffers 722 and data-out buffers 724 are coupled to data lines 702. During a write operation, data lines 702 provide data to data-in buffers 722. Sense amplifier 720 receives data from data-in buffers 722 and stores the data in memory array 710 as a charge on a capacitor of a cell at an address specified on address lines 704.

During a read operation, DRAM 700 transfers data to microprocessor 606 from memory array 710. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 720 detects and amplifies a difference in voltage between the complementary bit lines. The sense amplifier passes the amplified voltage to data-out buffers 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

CONCLUSION

A gate dielectric containing $HfAlO_3$ and a method of fabricating such a gate produces a reliable gate dielectric having an equivalent oxide thickness thinner than attainable using $SiO_2$. $HfAlO_3$ gate dielectrics formed using the methods described herein are thermodynamically stable such that the gate dielectrics formed will have minimal reactions with a silicon substrate or other structures during processing.

Transistors, higher level ICs or devices, and systems are constructed utilizing the novel process for forming a gate dielectric having an ultra thin equivalent oxide thickness, $t_{eq}$. Gate dielectric layers or films containing $HfAlO_3$ are formed having a high dielectric constant (κ), where the gate dielectrics are capable of a $t_{eq}$ thinner than 10 Å, thinner than the expected limit for $SiO_2$ gate dielectrics. At the same time, the physical thickness of the $HfAlO_3$ layer is much larger than the $SiO_2$ thickness associated with the $t_{eq}$ limit of $SiO_2$. Forming the larger thickness provides advantages in processing the gate dielectric. In addition forming a dielectric containing $HfAlO_3$, $Al_2O_3$, and $HfO_2$ through controlling a hafnium sequence and a aluminum sequence in an ALD processing of a substrate allows the selection of a dielectric constant ranging from that of $Al_2O_3$ to the dielectric constant of $HfO_2$.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A transistor comprising:

a body region between a first and a second source/drain region;

a dielectric film disposed on the body region between the first and second source/drain regions, the dielectric film containing a layer of $HfAlO_3$, the layer of $HfAlO_3$ having a thickness, the thickness being essentially equal to a minimum number of monolayers of $HfAlO_3$ to provide a bulk band gap of the $HfAlO_3$; and a gate coupled to and contacting the dielectric film.

2. The transistor of claim 1, wherein the dielectric film includes $Al_2O_3$.

3. The transistor of claim 1, wherein the dielectric film is substantially amorphous.

4. The transistor of claim 1, wherein the dielectric film exhibits a dielectric constant in the range from about 9 to about 25.

5. The transistor of claim 1, wherein the dielectric film exhibits an equivalent oxide thickness ($t_{eq}$) in the range from about 3 Angstroms to about 12 Angstroms.

6. The transistor of claim 1, wherein the dielectric film exhibits an equivalent oxide thickness ($t_{eq}$) of less than 3 Angstroms.

7. The transistor of claim 1, wherein the transistor is configured in a memory.

8. The transistor of claim 1, wherein the transistor is configured in an electronic system.

9. A transistor comprising:

a body region between a first and a second source/drain region;

a film disposed on the body region between the first and second source/drain regions, the film containing a layer of $HfAlO_3$ and a layer of $HfO_2$ such that the layer of $HfAlO_3$ has a thickness, the thickness being essentially equal to a minimum number of monolayers of $HfAlO_3$ to provide a bulk band gap of the $HfAlO_3$; and a gate coupled to and contacting the film;

the film formed by atomic layer deposition including:

pulsing a hafnium containing precursor into a reaction chamber containing a substrate;

pulsing a first oxygen containing precursor into the reaction chamber;

pulsing an aluminum containing precursor into a reaction chamber; and pulsing a second oxygen containing precursor into the reaction chamber.

10. The transistor of claim 9, wherein pulsing a hafnium containing precursor into a reaction chamber includes pulsing a $HfCl_4$ source gas into the reaction chamber.

11. The transistor of claim 9, wherein pulsing an aluminum containing precursor into the reaction chamber includes pulsing an adduct of alane ($AlH_3$) and dimethylehtylamine $[N(CH_3)_2(C_2H_5)]$ as a source gas into the reaction chamber.

12. The transistor of claim 9, wherein pulsing an aluminum containing precursor into the reaction chamber includes pulsing a trimethylaluminium source gas into the reaction chamber.

13. A memory having a memory array comprising:

a number of access transistors, each access transistor including a gate coupled to and contacting a film, the film containing a layer of $HfAlO_3$ and a layer of $HfO_2$ such that the layer of $HfAlO_3$ a thickness, the thickness being essentially equal to a minimum number of monolayers of $HfAlO_3$ to provide a bulk band gap of the $HfAlO_3$, the film formed on a body region between a first and a second source/drain regions;

a number of word lines coupled to a number of the gates of the number of access transistors;

a number of source lines coupled to a number of the first source/drain regions of the number of access transistors; and a number of bit lines coupled to a number of the second source/drain regions of the number of access transistors;

the film formed by atomic layer deposition including:

pulsing a hafnium containing source gas into a reaction chamber containing a substrate;

pulsing an aluminum containing source gas into the reaction chamber.

14. The memory of claim 13, wherein pulsing a hafnium containing source gas into a reaction chamber includes pulsing a $HfCl_4$ source gas into the reaction chamber.

15. The memory of claim 13, wherein pulsing an aluminum containing source gas into the reaction chamber includes pulsing an adduct of alane ($AlH_3$) and dimethylehtylamine $[N(CH_3)_2(C_2H_5)]$ as a source gas into the reaction chamber.

16. The memory of claim 13, wherein pulsing an aluminum containing source gas into the reaction chamber includes pulsing a trimethylaluminium source gas into the reaction chamber.

17. A memory having a memory array comprising:

a number of access transistors, each access transistor including a gate coupled to and contacting a film, the film containing a layer of $HfAlO_3$, the layer of $HfAlO_3$ having a thickness, the thickness being essentially equal to a minimum number of monolayers of $HfAlO_3$ to provide a bulk band gap of the $HfAlO_3$, the film disposed on a body region between a first and a second source/drain regions;

a number of word lines coupled to a number of the gates of the number of access transistors;

a number of source lines coupled to a number of the first source/drain regions of the number of access transistors; and a number of bit lines coupled to a number of the second source/drain regions of the number of access transistors.

18. The memory of claim 17, wherein the film exhibits a dielectric constant in the range from about 9 to about 25.

19. The memory of claim 17, wherein the film exhibits an equivalent oxide thickness ($t_{eq}$) in the range from about 3 Angstroms to about 12 Angstroms.

20. An electronic system comprising:

a processor;

a memory, the memory having an array including:

a number of access transistors, each access transistor having a gate coupled to and contacting a film, the film containing a layer of $HfAlO_3$ and a layer of $HfO_2$ such that the layer of $HfAlO_3$ has a thickness, the thickness being essentially equal to a minimum number of monolayers of $HfAlO_3$ to provide a bulk band gap of the $HfAlO_3$, the film formed on a body region between a first and a second source/drain regions;

a number of word lines coupled to a number of the gates of the number of access transistors;

a number of source lines coupled to a number of the first source/drain regions of the number of access transistors;

a number of bit lines coupled to a number of the second source/drain regions of the number of access transistors; and a system bus that couples the processor to the memory array;

the $HfAlO_3$ formed by atomic layer deposition including:

pulsing a hafnium containing source gas into a reaction chamber containing a substrate; and pulsing an aluminum containing source gas into a reaction chamber.

21. The electronic system of claim 20, wherein pulsing a hafnium containing source gas into a reaction chamber includes pulsing a $HfCl_4$ source gas into the reaction chamber.

22. The electronic system of claim 20, wherein pulsing an aluminum containing source gas into the reaction chamber includes pulsing an adduct of alane ($AlH_3$) and dimethylehtylamine [$N(CH_3)_2(C_2H_5)$] as a source gas into the reaction chamber.

23. The electronic system of claim 20, wherein pulsing an aluminum containing source gas into the reaction chamber includes pulsing a trimethylaluminium source gas into the reaction chamber.

24. An electronic system comprising:

a processor; and a memory, the memory having an array including:

a number of access transistors, each access transistor having a gate coupled to and contacting a film, the film containing a layer of $HfAlO_3$, the layer of $HfAlO_3$ having a thickness, the thickness being essentially equal to a minimum number of monolayers of $HfAlO_3$ to provide a bulk band gap of the $HfAlO_3$, the film formed on a body region between a first and a second source/drain regions;

a number of word lines coupled to a number of the gates of the number of access transistors;

a number of source lines coupled to a number of the first source/drain regions of the number of access transistors;

a number of bit lines coupled to a number of the second source/drain regions of the number of access transistors; and a system bus that couples the processor to the memory array.

25. The electronic system of claim 24, wherein the film exhibits a dielectric constant in the range from about 9 to about 25.

26. The electronic system of claim 24, wherein the film exhibits an equivalent oxide thickness ($t_{eq}$) in the range from about 3 Angstroms to about 12 Angstroms.

27. The transistor of claim 1, wherein the film is without a silicon oxide layer.

28. The memory of claim 17, wherein the film is without a silicon oxide layer.

29. The electronic system of claim 24, wherein the film is without a silicon oxide layer.

* * * * *

UNITED STATES PATENT AND TRADEMARK OFFICE

CERTIFICATE OF CORRECTION

PATENT NO. : 7,554,161 B2
APPLICATION NO. : 10/930431
DATED : June 30, 2009
INVENTOR(S) : Kie Y. Ahn et al.

It is certified that error appears in the above-identified patent and that said Letters Patent is hereby corrected as shown below:

On the Title page, in field (54), in “Title”, in column 1, line 1, delete “$HFALO_3$” and insert -- $HfAlO_3$ --, therefor.

On the Title page, in field (56), under “Other Publications”, in column 2, line 2, delete “The” and insert -- Thin --, therefor.

On the Title page, in field (57), under “Abstract”, in column 2, lines 8-9, delete “dimethylehtylamine” and insert -- dimethylethylamine --, therefor.

In column 1, line 1, delete “$HFALO_3$” and insert -- $HfAlO_3$ --, therefor.

In column 1, line 9, before “commonly” insert -- co-pending, --.

In column 18, line 16, in Claim 11, delete “dimethylehtylamine” and insert -- dimethylethylamine --, therefor.

In column 18, line 26, in Claim 13, after “$HfAlO_3$” insert -- has --.

In column 18, line 48, in Claim 15, delete “dimethylehtylamine” and insert -- dimethylethylamine --, therefor.

In column 19, lines 39-40, in Claim 22, delete “dimethylehtylamine” and insert -- dimethylethylamine --, therefor.

Signed and Sealed this

Twenty-fifth Day of August, 2009

David J. Kappos
*Director of the United States Patent and Trademark Office*